US011444161B2

(12) United States Patent
Fujiwara et al.

(10) Patent No.: US 11,444,161 B2
(45) Date of Patent: Sep. 13, 2022

(54) GROUP III-V COMPOUND SEMICONDUCTOR SUBSTRATE AND GROUP III-V COMPOUND SEMICONDUCTOR SUBSTRATE WITH EPITAXIAL LAYER

(71) Applicant: Sumitomo Electric Industries, Ltd., Osaka (JP)

(72) Inventors: Shinya Fujiwara, Osaka (JP); Tomoaki Miyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/080,165

(22) Filed: Oct. 26, 2020

(65) Prior Publication Data
US 2021/0057527 A1    Feb. 25, 2021

Related U.S. Application Data

(63) Continuation of application No. 16/342,618, filed as application No. PCT/JP2018/017452 on May 1, 2018, now Pat. No. 10,964,786.

(51) Int. Cl.
*H01L 29/201* (2006.01)
*H01L 23/31* (2006.01)
(Continued)

(52) U.S. Cl.
CPC ...... *H01L 29/201* (2013.01); *H01L 21/02043* (2013.01); *H01L 23/3107* (2013.01); *H01L 29/34* (2013.01); *H01L 29/36* (2013.01)

(58) Field of Classification Search
CPC ............... H01L 29/34; H01L 21/02043; H01L 21/20–2085; H01L 23/3157–3192;
(Continued)

(56) References Cited

U.S. PATENT DOCUMENTS 4,519,846 A   5/1985 Aigo
6,287,178 B1  9/2001 Huynh et al.
(Continued)

FOREIGN PATENT DOCUMENTS

CN   101630641 A   1/2010
CN   102187020 A   9/2011
(Continued)

OTHER PUBLICATIONS

Notice of Allowance dated Nov. 23, 2020 that issued in U.S. Appl. No. 16/342,618.
(Continued)

Primary Examiner — Sonya McCall-Shepard
(74) Attorney, Agent, or Firm — Faegre Drinker Biddle & Reath LLP

(57) ABSTRACT

An InP substrate, being a group III-V compound semiconductor substrate, that includes, on a main surface thereof, 0.22 particles/cm$^2$ that have a particle diameter of at least 0.19 μm or 20 particles/cm$^2$ that have a particle diameter of 0.079 μm. An InP substrate with an epitaxial layer, being a group III-V compound semiconductor substrate with an epitaxial layer, includes: the InP substrate and an epitaxial layer arranged upon the main surface of the InP substrate; and, upon the main surface thereof when the thickness of the epitaxial layer is 0.3 μm, no more than 10 LPD that have a circle-equivalent diameter of at least 0.24 μm, per cm$^2$, or no more than 30 LPD that have a circle-equivalent diameter of at least 0.136 μm, per cm$^2$. As a result, a group III-V compound semiconductor substrate capable of reducing defects in an epitaxial layer grown upon a main surface thereof and a group III-V compound semiconductor substrate with an epitaxial layer are provided.

9 Claims, 9 Drawing Sheets

(51) Int. Cl.
*H01L 29/34* (2006.01)
*H01L 29/36* (2006.01)
*H01L 21/02* (2006.01)

(58) Field of Classification Search
CPC ......... H01L 21/02104–02282; H01L 21/0229; H01L 27/1259; H01L 27/1262; H01L 51/0002; H01L 51/0003; H01L 21/30; H01L 21/31; H01L 21/312–3128
See application file for complete search history.

(56) References Cited

U.S. PATENT DOCUMENTS

| | | |
|---|---|---|
| 2007/0012242 A1† | 1/2007 | Jurisch |
| 2010/0013053 A1 | 1/2010 | Nakayama et al. |
| 2011/0193196 A1 | 8/2011 | Okita |
| 2012/0292747 A1† | 11/2012 | Miyahara |
| 2013/0334492 A1 | 12/2013 | Iguchi et al. |
| 2020/0052075 A1 | 2/2020 | Fujiwara et al. |

FOREIGN PATENT DOCUMENTS

| | | |
|---|---|---|
| JP | 2006-016249 A | 1/2006 |
| JP | 2010-248050 A | 11/2010 |
| WO | WO 2012/157476 A1 | 11/2012 |

OTHER PUBLICATIONS

Journal of the Korean Physical Society, vol. 54, No. 2, Feb. 2009, pp. 744-748.

O. Oda, H. Yamamoto, K. Kainosho, T. Imaizumi, H. Okazaki: "Recent developments of bulk 111-V materials: annealing and defect control," Inst. Phys. Conf. Ser. No. 135, pp. 285-293, 1993 (Year: 1993).

† cited by third party

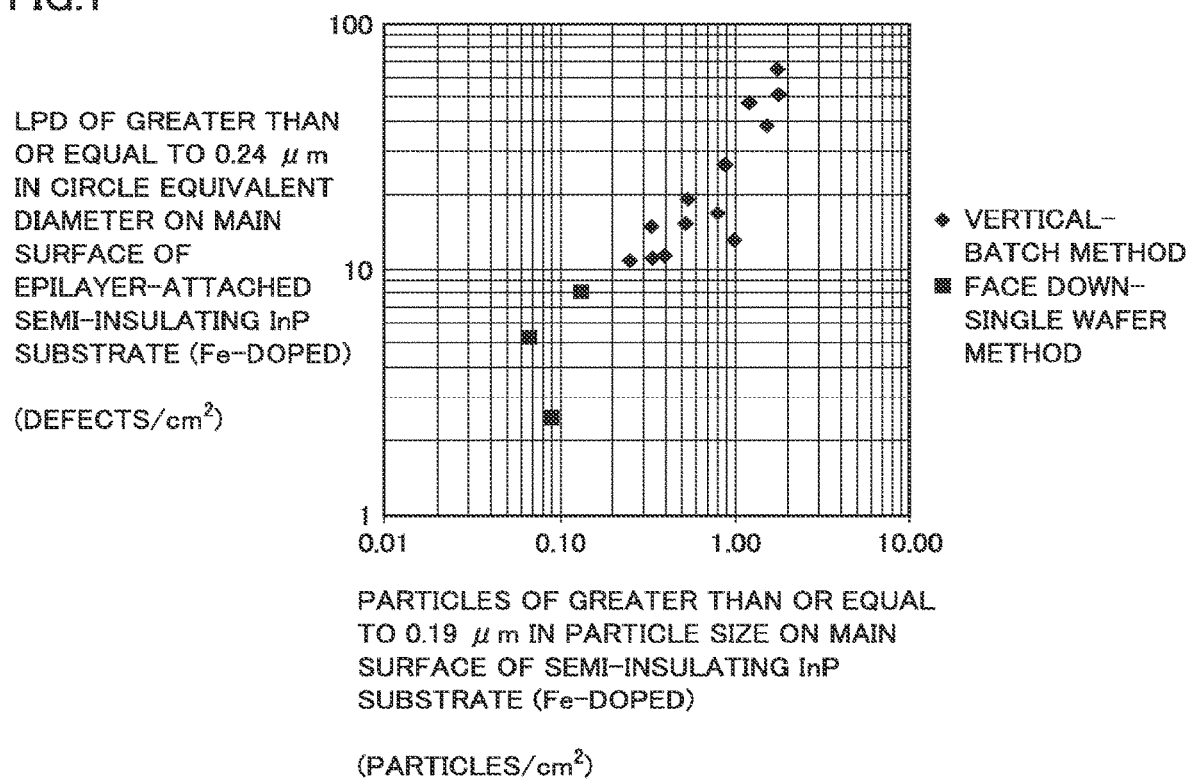

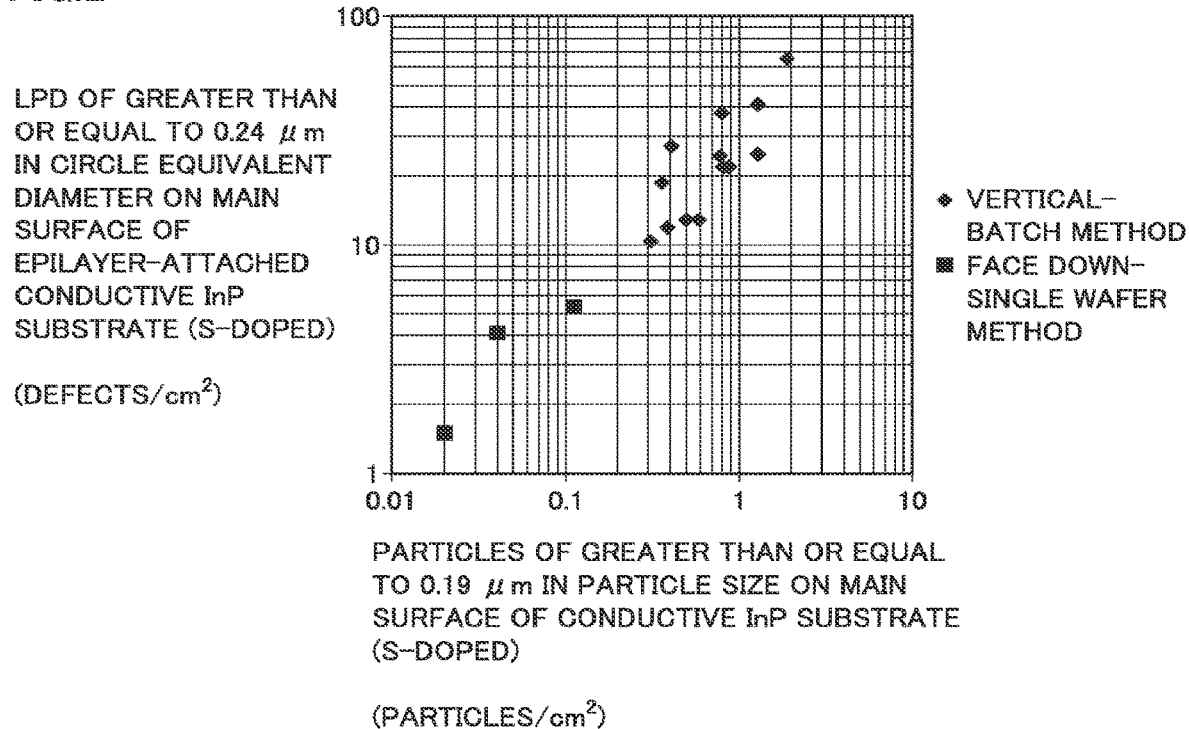
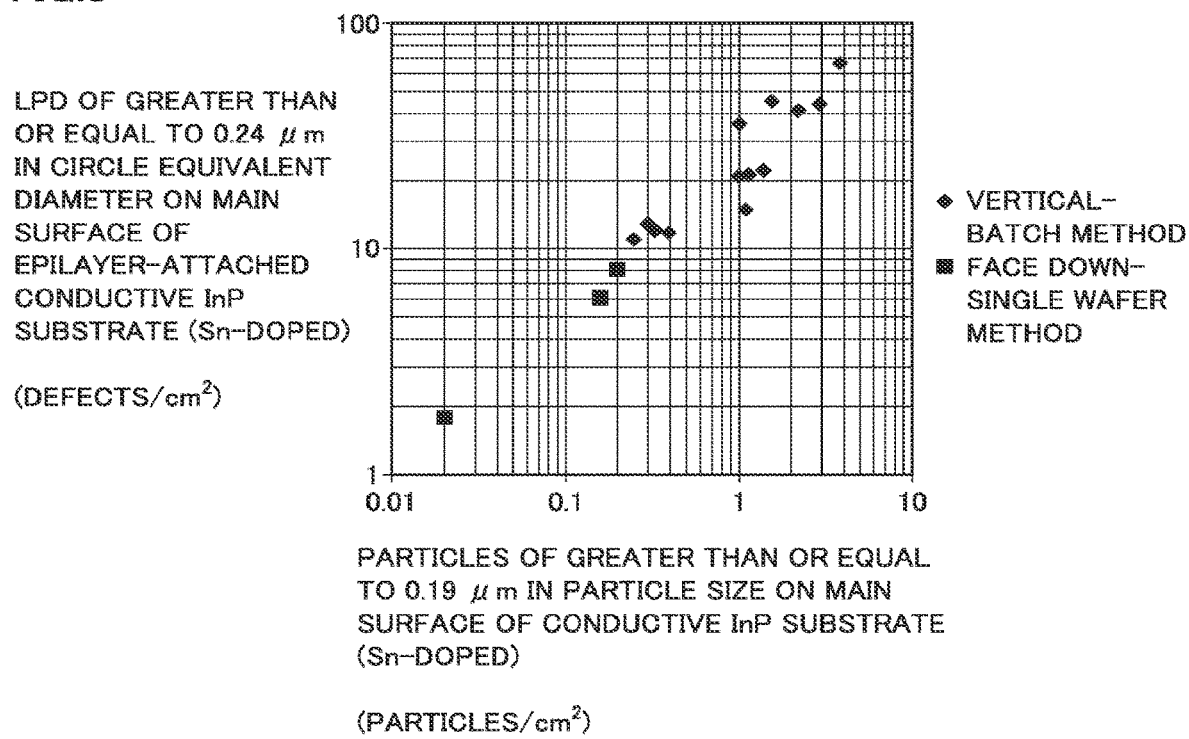

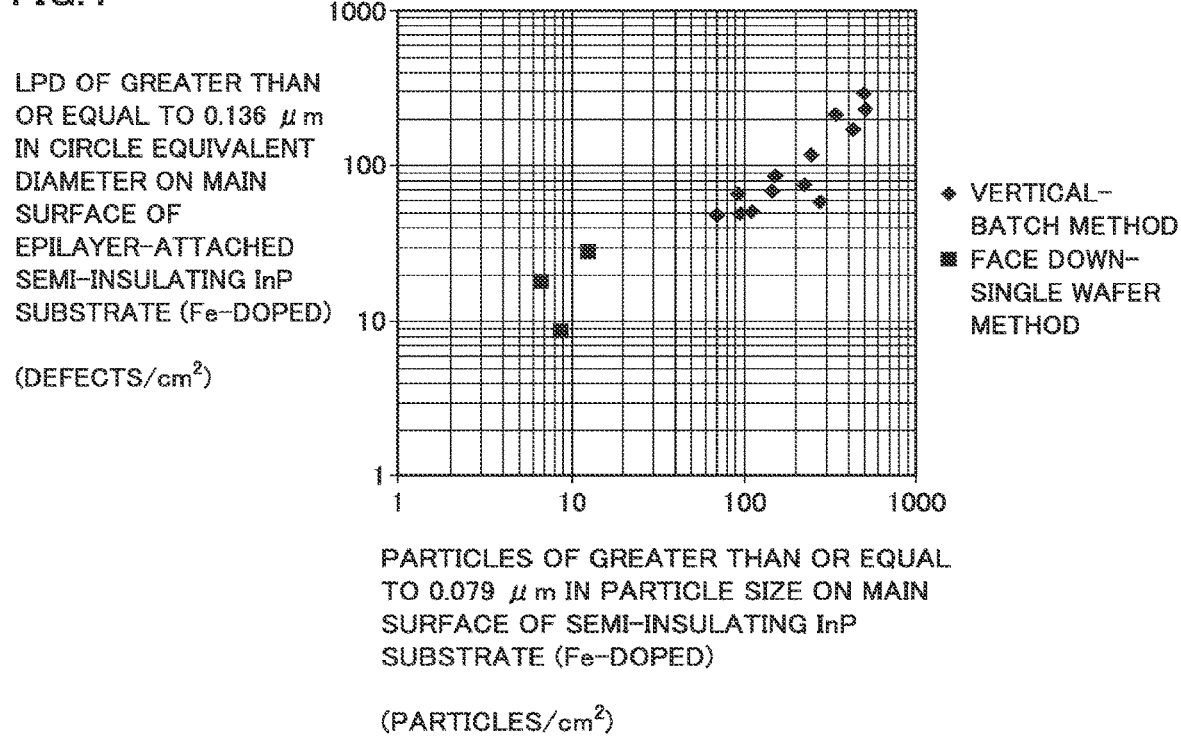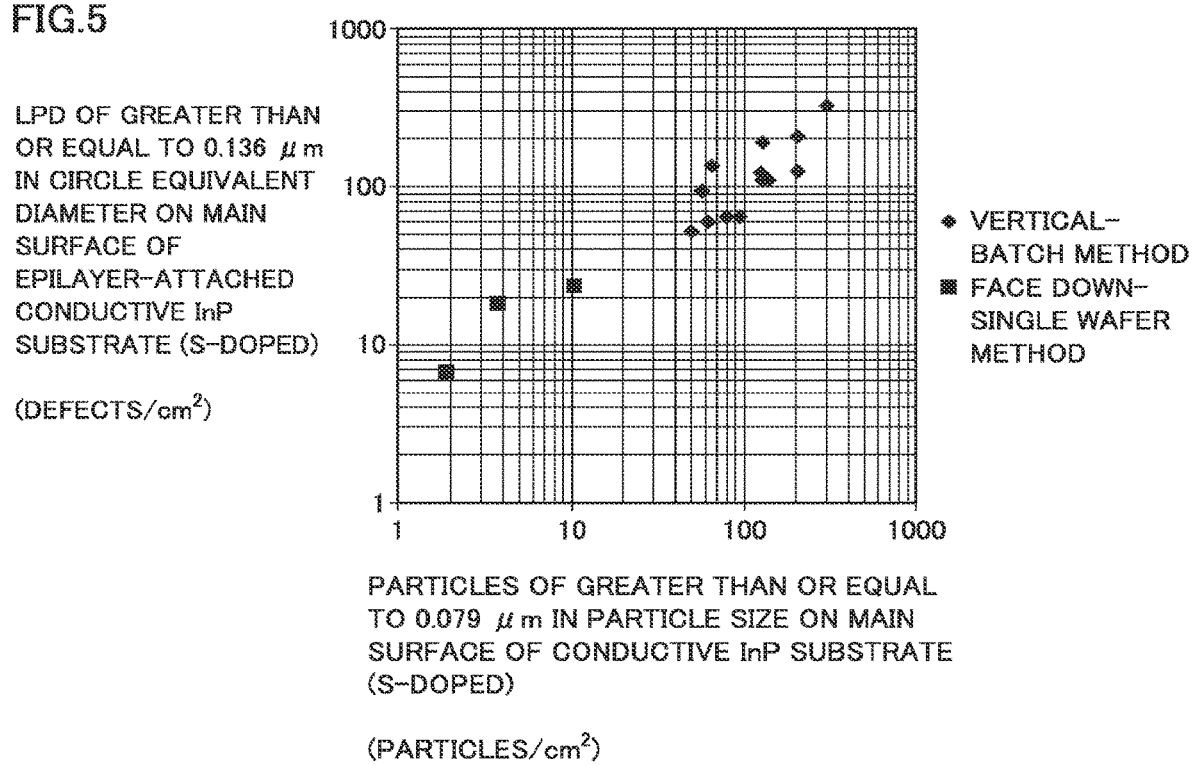

LPD OF GREATER THAN OR EQUAL TO 0.136 μm IN CIRCLE EQUIVALENT DIAMETER ON MAIN SURFACE OF EPILAYER-ATTACHED CONDUCTIVE InP SUBSTRATE (Sn-DOPED)

(DEFECTS/cm²)

PARTICLES OF GREATER THAN OR EQUAL TO 0.079 μm IN PARTICLE SIZE ON MAIN SURFACE OF CONDUCTIVE InP SUBSTRATE (Sn-DOPED)

(PARTICLES/cm²)

♦ VERTICAL-BATCH METHOD
■ FACE DOWN-SINGLE WAFER METHOD

FIG.12

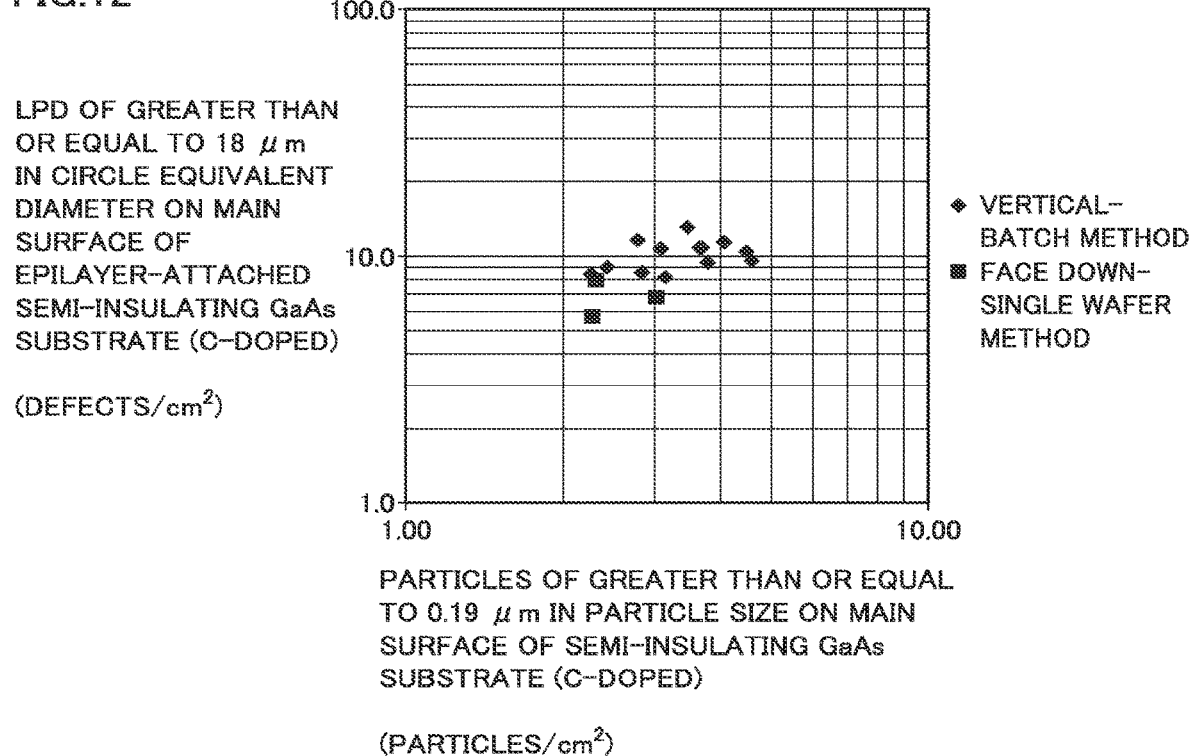

LPD OF GREATER THAN OR EQUAL TO 18 μm IN CIRCLE EQUIVALENT DIAMETER ON MAIN SURFACE OF EPILAYER-ATTACHED SEMI-INSULATING GaAs SUBSTRATE (C-DOPED)

(DEFECTS/cm²)

◆ VERTICAL-BATCH METHOD
■ FACE DOWN-SINGLE WAFER METHOD

PARTICLES OF GREATER THAN OR EQUAL TO 0.19 μm IN PARTICLE SIZE ON MAIN SURFACE OF SEMI-INSULATING GaAs SUBSTRATE (C-DOPED)

(PARTICLES/cm²)

FIG.13

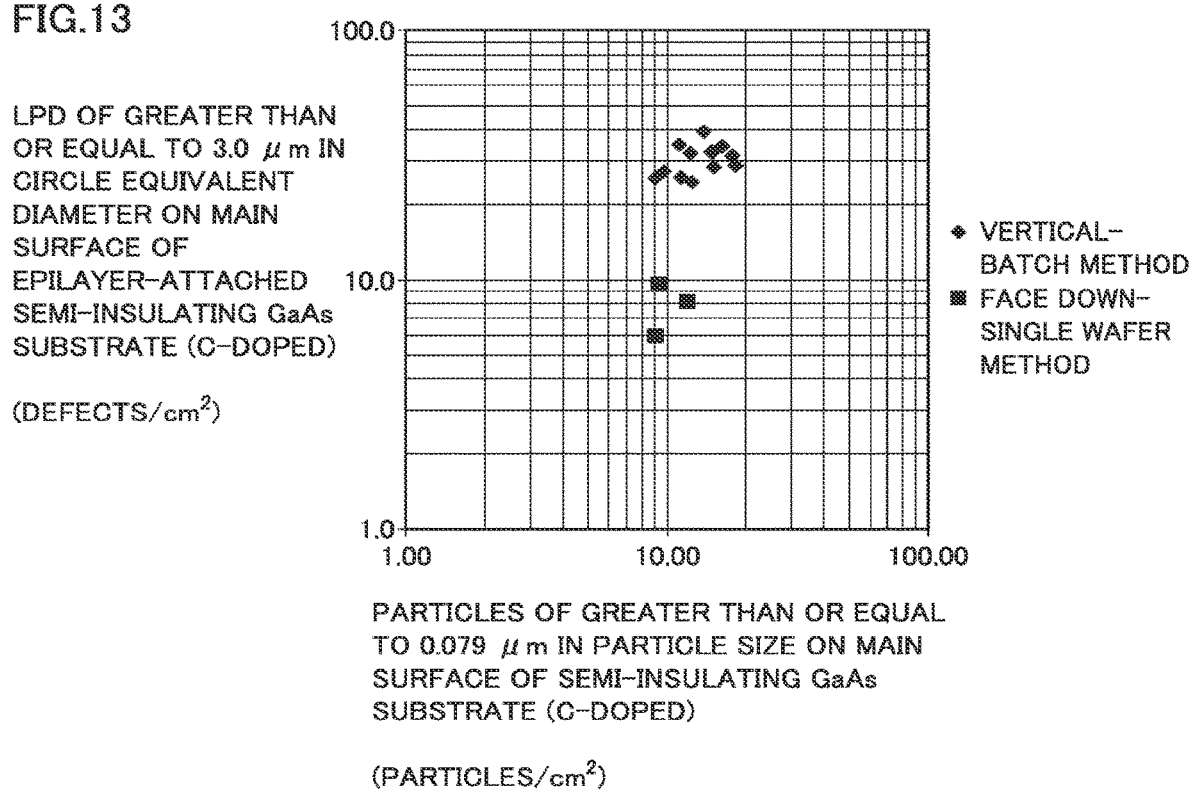

LPD OF GREATER THAN OR EQUAL TO 3.0 μm IN CIRCLE EQUIVALENT DIAMETER ON MAIN SURFACE OF EPILAYER-ATTACHED SEMI-INSULATING GaAs SUBSTRATE (C-DOPED)

(DEFECTS/cm²)

◆ VERTICAL-BATCH METHOD
■ FACE DOWN-SINGLE WAFER METHOD

PARTICLES OF GREATER THAN OR EQUAL TO 0.079 μm IN PARTICLE SIZE ON MAIN SURFACE OF SEMI-INSULATING GaAs SUBSTRATE (C-DOPED)

(PARTICLES/cm²)

GROUP III-V COMPOUND SEMICONDUCTOR SUBSTRATE AND GROUP III-V COMPOUND SEMICONDUCTOR SUBSTRATE WITH EPITAXIAL LAYER

This application claims priority based on International Application No. PCT/JP2017/019722 filed May 26, 2017, and the contents described in the foregoing international application are incorporated herein by reference in their entirety.

TECHNICAL FIELD

The present invention relates to a group III-V compound semiconductor substrate and a group III-V compound semiconductor substrate with an epitaxial layer.

BACKGROUND ART

Group III-V compound semiconductor substrates such as an indium phosphide substrate or a gallium arsenide substrate are suitably used as substrates of semiconductor devices, and in order to obtain high-performance semiconductor devices by causing high-quality epitaxial layers to grow on the main surfaces of the substrates, cleanness of the main surfaces is required.

Japanese Patent Laying-Open No. 2010-248050 (Patent Literature 1) discloses a method for manufacturing an indium phosphide substrate (InP substrate), including: a step of preparing an indium phosphide substrate; a step of cleaning the indium phosphide substrate with a sulfuric acid/hydrogen peroxide mixture; and a step of cleaning the indium phosphide substrate with a sulfuric acid after the step of cleaning with the sulfuric acid/hydrogen peroxide mixture. Furthermore, an indium phosphide substrate with a surface is disclosed, where on the surface, the sulfate ion concentration is less than or equal to 0.6 ng/cm$^2$, and the concentration of oxygen bonded to other than sulfur and the concentration of carbon are less than or equal to 40 atomic %.

International Publication No. 2012/157476 (Patent Literature 2) discloses a compound semiconductor substrate such as GaAs, InP, or GaP with at least one main surface subjected to mirror polishing, where the surface subjected to the mirror polishing is coated with an organic substance containing hydrogen (H), carbon (C), and oxygen (O).

CITATION LIST

Patent Literature

PTL 1: Japanese Patent Laying-Open No. 2010-248050
PTL 2: International Publication No. 2012/157476

SUMMARY OF INVENTION

A group III-V compound semiconductor substrate according to a first aspect of the present disclosure is an indium phosphide substrate (InP substrate), including particles of greater than or equal to 0.19 μm in particle size at less than or equal to 0.22 particles/cm$^2$ on a main surface.

A group III-V compound semiconductor substrate according to a second aspect of the present disclosure is an indium phosphide substrate (InP substrate), including particles of greater than or equal to 0.079 μm in particle size at less than or equal to 20 particles/cm$^2$ on a main surface.

An epitaxial layer (epilayer)-attached group III-V compound semiconductor substrate according to a third aspect of the present disclosure includes the group III-V compound semiconductor substrate (i.e., InP substrate) according to the first aspect, and an epitaxial layer disposed on the main surface of the group III-V compound semiconductor substrate, and includes light point defects (LPDs) of greater than or equal to 0.24 μm in circle-equivalent diameter at less than or equal to 10 defects/cm$^2$ on the main surface in a case where the epitaxial layer has a thickness of 0.3 μm.

An epitaxial layer (epilayer)-attached group III-V compound semiconductor substrate according to a fourth aspect of the present disclosure includes the group III-V compound semiconductor substrate (i.e., InP substrate) according to the second aspect, and an epitaxial layer disposed on the main surface of the group III-V compound semiconductor substrate, and includes light point defects (LPDs) of greater than or equal to 0.136 μm in circle-equivalent diameter at less than or equal to 30 defects/cm$^2$ on the main surface in a case where the epitaxial layer has a thickness of 0.3 μm.

A group III-V compound semiconductor substrate according to a fifth aspect of the present disclosure is a conductive gallium arsenide substrate (conductive GaAs substrate), including particles of greater than or equal to 0.079 μm in particle size at less than or equal to 1.0 particle/cm$^2$ on a main surface.

An epitaxial layer (epilayer)-attached group III-V compound semiconductor substrate according to a sixth aspect of the present disclosure includes the group III-V compound semiconductor substrate (i.e., conductive GaAs substrate) according to the fifth aspect, and an epitaxial layer disposed on the main surface of the group III-V compound semiconductor substrate, and includes light point defects (LPDs) of greater than or equal to 3.0 μm in circle-equivalent diameter at less than or equal to 5 defects/cm$^2$ on the main surface in a case where the epitaxial layer has a thickness of 5 μm.

An epitaxial layer (epilayer)-attached group III-V compound semiconductor substrate according to a seventh aspect of the present disclosure includes a group III-V compound semiconductor substrate, and an epitaxial layer disposed on the main surface of the group III-V compound semiconductor substrate, and the group III-V compound semiconductor substrate is a semi-insulating gallium arsenide substrate (semi-insulating GaAs substrate) including particles of greater than or equal to 0.079 μm in particle size at less than or equal to 12 particles/cm$^2$ on a main surface, and including light point defects (LPDs) of greater than or equal to 3.0 μm in circle-equivalent diameter at less than or equal to 10 defects/cm$^2$ on the main surface in a case where the epitaxial layer has a thickness of 5 μm.

BRIEF DESCRIPTION OF DRAWINGS

FIG. 1 is a graph showing an example of the relation between the number of particles of greater than or equal to 0.19 μm in circle-equivalent diameter per 1 cm$^2$ on the main surface of a semi-insulating InP substrate (Fe-doped) and the number of LPDs of greater than or equal to 0.24 μm in circle-equivalent diameter per 1 cm$^2$ on the main surface of an epilayer of an epilayer-attached semi-insulating InP substrate (Fe-doped).

FIG. 2 is a graph showing an example of the relation between the number of particles of greater than or equal to 0.19 μm in circle-equivalent diameter per 1 cm$^2$ on the main surface of a conductive InP substrate (S-doped) and the number of LPDs of greater than or equal to 0.24 μm in circle-equivalent diameter per 1 cm² on the main surface of an epilayer of an epilayer-attached conductive InP substrate (S-doped).

FIG. 3 is a graph showing an example of the relation between the number of particles of greater than or equal to 0.19 μm in circle-equivalent diameter per 1 cm² on the main surface of a conductive InP substrate (Sn-doped) and the number of LPDs of greater than or equal to 0.24 μm in circle-equivalent diameter per 1 cm² on the main surface of an epilayer of an epilayer-attached conductive InP substrate (Sn-doped).

FIG. 4 is a graph showing an example of the relation between the number of particles of greater than or equal to 0.079 μm in circle-equivalent diameter per 1 cm² on the main surface of a semi-insulating InP substrate (Fe-doped) and the number of LPDs of greater than or equal to 0.136 μm in circle-equivalent diameter per 1 cm² on the main surface of an epilayer of an epilayer-attached semi-insulating InP substrate (Fe-doped).

FIG. 5 is a graph showing an example of the relation between the number of particles of greater than or equal to 0.079 μm in circle-equivalent diameter per 1 cm² on the main surface of a conductive InP substrate (S-doped) and the number of LPDs of greater than or equal to 0.136 μm in circle-equivalent diameter per 1 cm² on the main surface of an epilayer of an epilayer-attached conductive InP substrate (S-doped).

FIG. 12 is a graph showing an example of the relation between the number of particles of greater than or equal to 0.19 μm in circle-equivalent diameter per 1 cm² on the main surface of a semi-insulating GaAs substrate and the number of LPDs of greater than or equal to 18 μm in circle-equivalent diameter per 1 cm² on the main surface of an epilayer of an epilayer-attached semi-insulating GaAs substrate.

FIG. 13 is a graph showing an example of the relation between the number of particles of greater than or equal to 0.079 μm in circle-equivalent diameter per 1 cm² on the main surface of a semi-insulating GaAs substrate and the number of LPDs of greater than or equal to 3.0 μm in circle-equivalent diameter per 1 cm² on the main surface of an epilayer of an epilayer-attached semi-insulating GaAs substrate.

DETAILED DESCRIPTION

Figure 6:
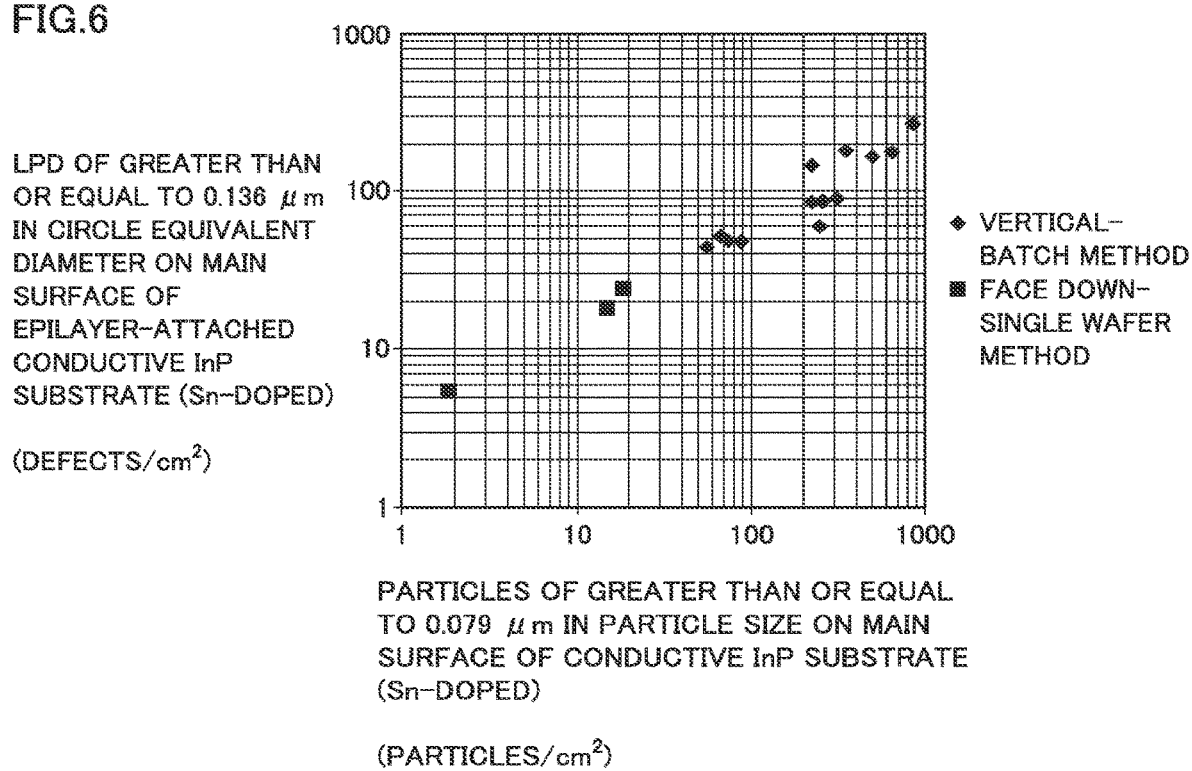
FIG. 6 is a graph showing an example of the relation between the number of particles of greater than or equal to 0.079 μm in circle-equivalent diameter per 1 cm² on the main surface of a conductive InP substrate (Sn-doped) and the number of LPDs of greater than or equal to 0.136 μm in circle-equivalent diameter per 1 cm² on the main surface of an epilayer of an epilayer-attached conductive InP substrate (Sn-doped).

Problem to be Solved by the Present Disclosure

The indium phosphide substrate disclosed in Japanese Patent Laying-Open No. 2010-248050 (Patent Literature 1) has a problem that the epitaxial layer grown on the substrate may have defects increased in some cases, although the impurity concentration is reduced such that the concentration of sulfate ions on the surface of the substrate is less than or equal to 0.6 ng/cm², and the concentration of oxygen bonded to other than sulfur and the concentration of carbon are less than or equal to 40 atomic %.

The compound semiconductor substrate disclosed in International Publication No. 2012/157476 has a problem that the epitaxial layer grown on the substrate may have defects increased in some cases, although impurities on the mirror-polished surface can be kept down.

Therefore, an object of the disclosure is to solve the problems mentioned above, and provide a group III-V compound semiconductor substrate and an epitaxial layer-attached group III-V compound semiconductor substrate with few impurities on a main surface, that is, with a clean main surface, which can reduce defects of the epitaxial layer grown on the main surface.

Advantageous Effect of the Present Disclosure

According to the present disclosure, a group III-V compound semiconductor substrate and an epitaxial layer-attached group III-V compound semiconductor substrate with few impurities on a main surface, that is, with a clean main surface can be provided which can reduce defects of the epitaxial layer grown on the main surface.

Description of Embodiments

First, embodiments of the present invention will be listed and described.

[1] A group III-V compound semiconductor substrate according to a first aspect of the present invention is an InP substrate (indium phosphide substrate, the same applies hereinafter), including particles of greater than or equal to 0.19 μm in particle size at less than or equal to 0.22 particles/cm² on a main surface. This aspect can reduce defects of an epitaxial layer disposed on the main surface of the InP substrate that is the group III-V compound semiconductor substrate.

[2] A group III-V compound semiconductor substrate according to a second aspect of the present invention is an InP substrate, including particles of greater than or equal to 0.079 μm in particle size at less than or equal to 20 particles/cm² on a main surface. This aspect can reduce defects of an epitaxial layer disposed on the main surface of the InP substrate that is the group III-V compound semiconductor substrate.

[3] The group III-V compound semiconductor substrate (that is, the InP substrate) according to the first aspect or the second aspect is a semi-insulating InP substrate (semi-insulating indium phosphide substrate, the same applies hereinafter), and the main surface thereof can be covered with a protective film. Thus, the main surface of the semi-insulating InP substrate is kept clean. More specifically, even after storage for 1 year, the semi-insulating InP substrate with the main surface coated with the protective film can reduce defects of the epitaxial layer disposed on the main surface of the InP substrate after the storage. In this regard, the protective film evaporates in the temperature rising process before epitaxial growth, and does not remain on the surface before epitaxial growth.

[4] The group III-V compound semiconductor substrate (that is, the InP substrate) according to the first aspect or the second aspect is a semi-insulating InP substrate, and the protective film may include a surfactant. Thus, the main surface of the semi-insulating InP substrate is kept cleaner.

[5] The group III-V compound semiconductor substrate (that is, the InP substrate) according to the first aspect or the second aspect is a semi-insulating InP substrate, and the protective film may have a thickness of greater than or equal to 0.3 nm and less than or equal to 3 nm. Thus, the main surface of the semi-insulating InP substrate is kept cleaner.

[6] The group III-V compound semiconductor substrate according to the first aspect is a semi-insulating InP substrate, including particles of greater than or equal to 0.19 μm in particle size at less than or equal to 0.22 particles/cm$^2$ on the main surface, the main surface may be coated with a protective film, and the protective film may include a surfactant, and have a thickness of greater than or equal to 0.3 nm and less than or equal to 3 nm. This aspect can further reduce defects of an epitaxial layer disposed on the main surface of the semi-insulting InP substrate.

[7] The group III-V compound semiconductor substrate according to the second aspect is a semi-insulating InP substrate, including particles of greater than or equal to 0.079 μm in particle size at less than or equal to 20 particles/cm$^2$ on the main surface, the main surface may be coated with a protective film, and the protective film may include a surfactant, and have a thickness of greater than or equal to 0.3 nm and less than or equal to 3 nm. This aspect can further reduce defects of an epitaxial layer disposed on the main surface of the semi-insulting InP substrate.

[8] An epilayer-attached group III-V compound semiconductor substrate (epitaxial layer-attached group III-V compound semiconductor substrate, the same applies hereinafter) according to a third aspect of the present invention includes the group III-V compound semiconductor substrate (i.e., InP substrate) according to the first aspect, and an epitaxial layer disposed on the main surface of the group III-V compound semiconductor substrate, and includes LPDs (light point defects) of greater than or equal to 0.24 μm in circle-equivalent diameter at less than or equal to 10 defects/cm$^2$ on the main surface in a case where the epitaxial layer has a thickness of 0.3 μm. This aspect provides an epilayer-attached InP substrate including a less defective epitaxial layer.

[9] An epilayer-attached group III-V compound semiconductor substrate (epitaxial layer-attached group III-V compound semiconductor substrate) according to a fourth aspect of the present invention includes the group III-V compound semiconductor substrate (i.e., InP substrate) according to the second aspect, and an epitaxial layer disposed on the main surface of the group III-V compound semiconductor substrate, and includes LPDs (light point defects) of greater than or equal to 0.136 μm in circle-equivalent diameter at less than or equal to 30 defects/cm$^2$ on the main surface in a case where the epitaxial layer has a thickness of 0.3 μm. This aspect provides an epilayer-attached InP substrate including a less defective epitaxial layer.

[10] A group III-V compound semiconductor substrate according to a fifth aspect of the present invention is a conductive GaAs substrate (conductive gallium arsenide substrate, the same applies hereinafter), including particles of greater than or equal to 0.079 μm in particle size at less than or equal to 1.0 particle/cm$^2$ on a main surface. This aspect can reduce defects of an epitaxial layer disposed on the main surface of the conductive GaAs substrate that is the group III-V compound semiconductor substrate.

[11] An epilayer-attached group III-V compound semiconductor substrate (epitaxial layer-attached group III-V compound semiconductor substrate) according to a sixth aspect of the present invention includes the group III-V compound semiconductor substrate (i.e., conductive GaAs substrate) according to the fifth aspect, and an epitaxial layer disposed on the main surface of the group III-V compound semiconductor substrate, and includes LPDs (light point defects) of greater than or equal to 3.0 μm in circle-equivalent diameter at less than or equal to 5 defects/cm$^2$ on the main surface in a case where the epitaxial layer has a thickness of 5 μm. This aspect provides an epilayer-attached conductive GaAs substrate including a less defective epitaxial layer.

[12] An epilayer-attached group III-V compound semiconductor substrate (epitaxial layer-attached group III-V compound semiconductor substrate) according to a seventh aspect of the present invention includes a group III-V compound semiconductor substrate, and an epitaxial layer disposed on the main surface of the group III-V compound semiconductor substrate, and the group III-V compound semiconductor substrate is a semi-insulating GaAs substrate (semi-insulating gallium arsenide substrate, the same applies thereinafter) including particles of greater than or equal to 0.079 μm in particle size at less than or equal to 12 particles/cm$^2$ on a main surface, and including light point defects of greater than or equal to 3.0 μm in circle-equivalent diameter at less than or equal to 10 defects/cm$^2$ on the main surface in a case where the epitaxial layer has a thickness of 5 μm. This aspect provides an epilayer-attached group HI compound semiconductor substrate (i.e., an epilayer-attached i-GaAs substrate) including a less defective epitaxial layer.

DETAILS OF EMBODIMENTS OF PRESENT INVENTION

Embodiment 1

<Group III-V Compound Semiconductor Substrate>

The group III-V compound semiconductor substrate according to the present embodiment is an InP substrate (indium phosphide substrate), including particles of greater than or equal to 0.19 μm in particle size at less than or equal to 0.22 particles/cm$^2$, preferably less than or equal to 0.11 particles/cm$^2$ on a main surface. The InP substrate that is the group III-V compound semiconductor substrate according to the present embodiment can reduce defects of an epitaxial layer disposed on the main surface of the InP substrate, because the number of particles of greater than or equal to 0.19 μm in a particle size per 1 cm$^2$ on the main surface is as small as less than or equal to 0.22 particles/cm$^2$.

In this regard, the term "particles" refers to fine particles attached to a main surface of a wafer (a plate-like object including a substrate and/or an epitaxial layer). The number of particles per 1 cm$^2$ on the main surface is evaluated with a light scattering bright spot, i.e., LPD (light point defect) observed on the main surface of the wafer under a light collecting lamp in a dark room. In addition, the term "defect" refers to an LPD on the main surface of the wafer, and is evaluated with a light scattering bright spot observed on the main surface of the wafer under a light collecting lamp in a dark room. In addition, the epitaxial layer refers to a layer formed by epitaxial growth on the main surface of the substrate.

The present inventors examined various properties of the main surface of the InP substrate, required for reducing the LPD on the main surface of the epitaxial layer disposed on the main surface of the InP substrate. As shown in FIGS. 1 to 3, it has been found that there is a positive correlation between the number of particles of greater than or equal to 0.19 µm in particle size per unit area on the main surface of the InP substrate and the number of LPDs of greater than or equal to 0.24 µm in circle-equivalent diameter per unit area on the main surface in a case where the epitaxial layer disposed on the main surface of the InP substrate has a thickness of 0.3 µm. Furthermore, the number of particles of greater than or equal to 0.19 µm in particle size per 1 cm$^2$ on the main surface of the InP substrate is adjusted to less than or equal to 0.22 particles/cm$^2$ (preferably less than or equal to 0.11 particles/cm$^2$), thereby making it possible to reduce the number of LPDs of greater than or equal to 0.24 µm in circle-equivalent diameter per 1 cm$^2$ on the main surface in a case where the epitaxial layer disposed on the InP substrate has a thickness of 0.3 µm, to less than or equal to 10 defects/cm$^2$ (preferably less than or equal to 6 defects/cm$^2$ or less). Further, it is assumed from the conventional experience that as LPDs of the epitaxial layer are reduced, the semiconductor device is less deteriorated. In this way, the invention of the present embodiment has been achieved.

In this regard, the particle size of the particle on the main surface of the InP substrate means the diameter of a circle that is equal in area to a particle measured as an LPD. In addition, the circle-equivalent diameter of the LPD on the main surface of the epitaxial layer means the diameter of a circle that is equal in area to an LPD measured.

In addition, the number of particles of greater than or equal to 0.19 µm in particle size on the main surface of the InP substrate and the number of LPDs of greater than or equal to 0.24 µm in circle-equivalent diameter per 1 cm$^2$ on the main surface of the epitaxial layer are measured with the use of an argon ion laser with a wavelength of 488 nm as a light source of the light collecting lamp mentioned above. Examples of the measuring apparatus include Surfscan 6220 manufactured by Tencor Corporation.

Figure 7:
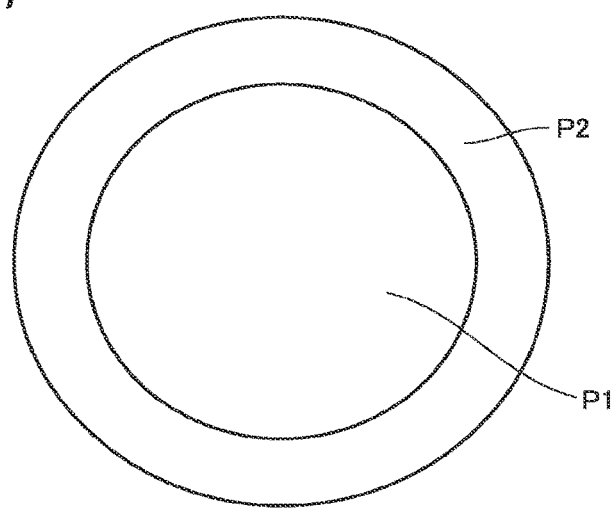
FIG. 7 is a schematic plan view illustrating an example of an inner periphery and an outer periphery on the main surface of a group III-V compound semiconductor substrate.

In addition, with reference to FIG. 7, the particles of greater than or equal to 0.19 µm in particle size on the main surface of the InP substrate that is the group III-V compound semiconductor substrate are, from the viewpoint of uniformly reducing defects of the epitaxial layer disposed on the main surface of the InP substrate, distributed concentrically on the main surface, the distribution thereof is increased at the outer periphery of the substrate, and the proportion of the number of particles present at an outer periphery P2 to the number of particles present over the entire main surface (an inner periphery P1 and outer periphery P2) is preferably greater than or equal to 50%, more preferably greater than or equal to 70%. In this regard, inner periphery P1 of the main surface refers to a circular part at the center, outer periphery P2 thereof refers to an annular part surrounding the inner periphery, and the area of inner periphery P1 is equal to the area of outer periphery P2. In addition, the fact that the particles are distributed concentrically on the main surface means that the existence probabilities of particles are equal on concentric circles of the main surface.

The InP substrate according to the present embodiment may have impurity atoms added in the substrate. More specifically, the InP substrate may be a semi-insulating InP substrate with Fe (iron) atoms added for lowering the conductivity, or a conductive InP substrate with S (sulfur) atoms and/or Sn (tin) atoms added for increasing the conductivity. In this regard, the semi-insulating InP substrate refers to, for example, an InP substrate that has a specific resistance of greater than or equal to $1 \times 10^7$ Ω·cm and less than or equal to $5 \times 10^8$ Ω·cm, and the conductive InP substrate is, for example, an InP substrate that has a specific resistance of less than or equal to 1 Ω·cm.

For the semi-insulating InP substrate of the InP substrate according to the present embodiment, the main surface is preferably with a protective film. Thus, the adhesion of particles and/or impurity atoms to the main surface is suppressed, thereby keeping the main surface clean.

The protective film is not particularly limited, but preferably includes a surfactant from the viewpoint of the main surface further kept clean by further suppressing the adhesion of particles and/or impurity atoms to the surface. In addition, the surfactant is not particularly limited, but preferably a nonionic surfactant from the viewpoint of the main surface further kept clean by further suppressing the adhesion of particles and/or impurity atoms to the surface. Suitable examples of the nonionic surfactant include higher alcohol type or alkylphenol type surfactants such as polyoxyalkylene alkyl ether, polyoxyethylene alkyl ether, and polyoxyethylene alkylphenyl ether; and fatty acid type surfactants such as sucrose fatty acid salt/ester, sorbitan fatty acid ester, polyoxyethylene sorbitan fatty acid ester, polyoxyethylene fatty acid ester, and alkanol amide; that have a molecular weight from 700 to 2000.

The thickness of the protective film is preferably greater than or equal to 0.3 nm, more preferably greater than or equal to 0.5 nm, from the viewpoint of the main surface further kept clean by the protective film that further suppresses the adhesion of particles and/or impurity atoms to the main surface. In addition, from the viewpoint of suppressing clouding of the main surface, the thickness is preferably less than or equal to 3 nm, more preferably less than or equal to 2 nm. The thickness of the protective film is measured by ellipsometry (SE-101 manufactured by Photonic Lattice Inc.).

For the semi-insulating InP substrate of the InP substrate according to the present embodiment, the main surface thereof is coated with the protective film, thereby making it possible to reduce defects of the epitaxial layer disposed on the main surface of the semi-insulating InP substrate, even after the storage of the semi-insulating InP substrate for 1 year. In this regard, the protective film evaporates in the temperature rising process before epitaxial growth, and does not remain on the surface before epitaxial growth.

The semi-insulating InP substrate of the InP substrate according to the present embodiment includes particles of greater than or equal to 0.19 µm in particle size at less than or equal to 0.22 particles/cm$^2$ on the main surface, the main surface is preferably coated with a protective film, and the protective film may include a surfactant, and have a thickness of greater than or equal to 0.3 nm and less than or equal to 3 nm. This aspect can further reduce defects of an epitaxial layer disposed on the main surface of the semi-insulting InP substrate.

<Method for Manufacturing Group III-V Compound Semiconductor Substrate>

Figure 8:
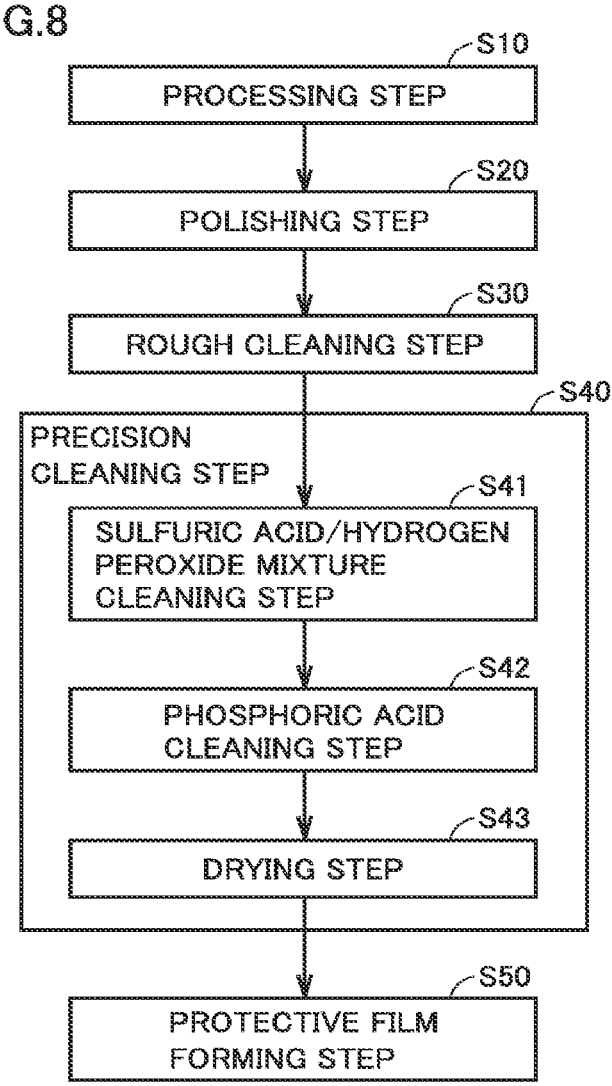
FIG. 8 is a flowchart showing an example of a method for manufacturing an InP substrate.

With reference to FIG. 8, the method for manufacturing the InP substrate that is the group III-V compound semiconductor substrate according to the present embodiment is not particularly limited, but from the viewpoint of efficiently manufacturing the InP substrate according to the present embodiment, the method preferably includes a processing step S10 of forming an InP substrate (indium phosphide substrate) by processing an InP (indium phosphide) crystalline body, a polishing step S20 of polishing the InP substrate, a rough cleaning step S30 of roughly cleaning the polished InP substrate, and a precision cleaning step S40 of precisely cleaning the roughly cleaned InP substrate. The precision cleaning step S40 preferably includes a sulfuric acid/hydrogen peroxide mixture cleaning step S41 of cleaning the roughly cleaned InP substrate with a sulfuric acid/hydrogen peroxide mixture, a phosphoric acid cleaning step S42 of cleaning, with a phosphoric acid, the InP substrate cleaned with the sulfuric acid/hydrogen peroxide mixture, and a drying step S43 of drying the InP substrate cleaned with the phosphoric acid.

(Processing Step)

First, in processing step S10, an InP crystalline body is sliced and chamfered to form an InP substrate. In this regard, the method for manufacturing the InP crystalline body is not particularly limited, and a VB (vertical Bridgman) method, a VGF (vertical temperature gradient freezing) method, an LEC (liquid encapsulated Czochralski) method, or the like is suitably used.

(Polishing Step)

Next, in polishing step S20, the main surface of the InP substrate is polished. The polishing method is not particularly limited, and mechanical polishing, mechanical chemical polishing (CMP), chemical polishing, or the like is suitably used.

(Rough Cleaning Step)

Next, in rough cleaning step S30, the InP substrate with the main surface polished is roughly cleaned. In this regard, rough cleaning refers to cleaning with an alkaline solution, cleaning with a hydrofluoric acid solution, and cleaning with an alkaline solution, for removing abrasives, polishing liquids, and the like attached to the main surface.

(Precision Cleaning Step)

Then, in precision cleaning step S40, sulfuric acid/hydrogen peroxide mixture cleaning step S41, phosphoric acid cleaning step S42, and drying step S43 are carried out. In sulfuric acid/hydrogen peroxide mixture cleaning step S41, the roughly cleaned InP substrate is cleaning with a sulfuric acid/hydrogen peroxide mixture (aqueous solution containing sulfuric acid and hydrogen peroxide). This step makes it possible to reduce the organic film and oxide film formed by the rough cleaning on the main surface of the InP substrate, as well as Si (silicon) and the like attached to the main surface. In phosphoric acid cleaning step S42, the InP substrate cleaned with the sulfuric acid/hydrogen peroxide mixture is cleaned with a phosphoric acid. This step makes it possible to reduce $SO_4^{2-}$ derived from the sulfuric acid attached to the main surface of the InP substrate through the sulfuric acid/hydrogen peroxide mixture cleaning, as well as Si remaining on the main surface. From the viewpoint of enhancing the respective cleaning efficiencies of sulfuric acid/hydrogen peroxide mixture cleaning step S41 and phosphoric acid cleaning step S42, it is preferable to include cleaning by ultra-pure water rinsing each after the cleaning with the sulfuric acid/hydrogen peroxide mixture in sulfuric acid/hydrogen peroxide mixture cleaning step S41 and after cleaning with the phosphoric acid in phosphoric acid cleaning step S42. In this regard, the ultra-pure water used for the ultra-pure rinsing refers to water that has an electric resistivity (specific resistance) of greater than or equal to 18 MC cm, a TOC (total organic carbon) of less than 10 g/L (liter), and a fine particle number of less than 100 particles/liter. In drying step S43, the InP substrate cleaned with the phosphoric acid is dried. The drying method is not particularly limited, but from the viewpoint of suppressing adhesion of particles to the main surface, a spin drying method, an IPA (isopropyl alcohol) vapor drying method, a hot air drying method, or the like is preferred.

Figure 9:
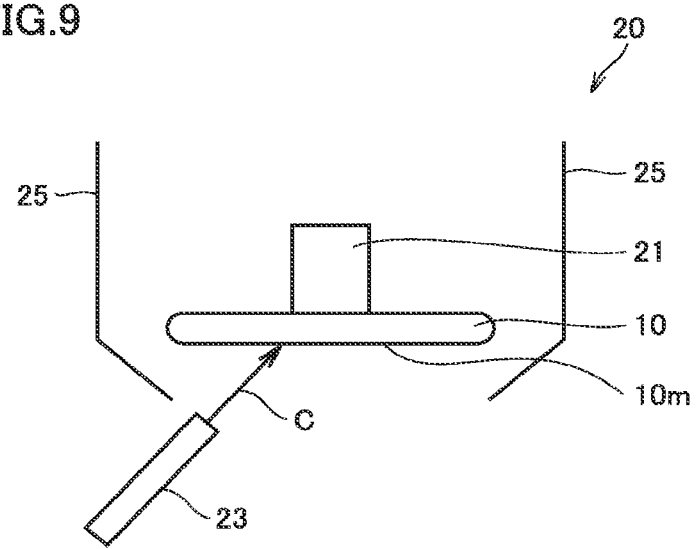
FIG. 9 is a schematic diagram illustrating an example of a method for cleaning a group III-V compound semiconductor substrate.

With reference to FIG. 9, the cleaning method in precision cleaning step S40 is preferably a single wafer method. In particular, a face down-single wafer method is more preferred in which a main surface 10m to be cleaned is turned downward, and cleaned by a single wafer method. Specifically, with the use of a cleaning apparatus including a holder 21 for holding the substrate, a cleaning liquid tank 23 located below the holder 21, and a chamber 25, the InP substrate that is a group III-V compound semiconductor substrate 10 is fixed to holder 21 with main surface 10m to be cleaned facing downward, and while rotating III-V compound semiconductor substrate 10 by holder 21 and moving cleaning liquid tank 23, a cleaning liquid C is supplied to main surface 10m from the lower side thereof to clean main surface 10m. According to the cleaning method, because of the main surface 10m facing downward, the adhesion of particles descending from above can be prevented from being attached, and particles on main surface 10m can be remarkably reduced particles because the particles attached to main surface 10m fall by gravity without being attached again. The cleaning method makes it possible to adjust particles of greater than or equal to 0.19 μm in particle size on the main surface 10m of the InP substrate that is the III-V compound semiconductor substrate 10, to less than or equal to 0.22 particles/cm$^2$, preferably less than or equal to 0.11 particles/cm$^2$.

In addition, with reference to FIG. 7, the particles of greater than or equal to 0.19 μm in particle size on the main surface 10m of InP substrate that is group III-V compound semiconductor substrate 10 are distributed concentrically, the distribution thereof is increased at the outer periphery of the substrate, and the proportion of the number of particles present at an outer periphery P2 to the number of particles present over the entire main surface (an inner periphery P1 and outer periphery P2) is preferably greater than or equal to 50%, more preferably greater than or equal to 70%.

The conventional cleaning method in precision cleaning step S40 is a vertical-batch method of putting a plurality of InP substrates in a cassette so that the main surfaces of the substrates are perpendicular to the horizontal plane, and immersing the cassette in a cleaning tank. The vertical-batch method has, because of a lot of contamination brought from the cassette and/or the InP substrate, the problem of many particles on the main surface of the InP substrate after the cleaning, and it is difficult to solve the problem.

The method for manufacturing the InP substrate according to the present embodiment includes processing step S10, polishing step S20, rough cleaning step S30, and precision cleaning step S40 mentioned above, thereby making it possible to efficiently manufacture the InP substrate where particles on the main surface are reduced remarkably.

(Protective Film Forming Step)

The method for manufacturing the semi-insulating InP substrate of the InP substrate according to the present embodiment preferably further includes a protective film forming step S50 of forming a protective film coating the main surface of the semi-insulating InP substrate. The formation of the protective film coating the main surface of the semi-insulating InP substrate makes it possible to keep the main surface of the semi-insulating InP substrate clean. More specifically, the main surface of the semi-insulating InP substrate is coated with the protective film, thereby making it possible to, even after storage for 1 year, reduce defects of the epitaxial layer disposed on the main surface of the semi-insulating InP substrate. In this regard, the protective film evaporates in the temperature rising process before epitaxial growth, and does not remain on the surface before epitaxial growth.

The method for forming the protective film is not particularly limited, but a method of immersing the semi-insulating InP substrate in a liquid for forming the protective film (for example, an aqueous solution containing a surfactant), and then spin-drying the substrate with the use of a normal batch-type cleaning apparatus, or a method of carrying out spin coating by supplying a liquid for forming the protective film to the main surface from the upper side of the main surface of the semi-insulating InP substrate while rotating the semi-insulating InP substrate, with the use of a normal single wafer-type cleaning apparatus is preferred as described in International Publication No. 2012/157476, from the viewpoint of efficiently forming a uniform protective film.

Embodiment 2

<Group III-V Compound Semiconductor Substrate>

The group III-V compound semiconductor substrate according to the present embodiment is an InP substrate (indium phosphide substrate), including particles of greater than or equal to 0.079 μm in particle size at less than or equal to 20 particles/cm$^2$, preferably less than or equal to 15 particles/cm$^2$ on a main surface. The InP substrate that is the group III-V compound semiconductor substrate according to the present embodiment can reduce defects of an epitaxial layer disposed on the main surface of the InP substrate, because the number of particles of greater than or equal to 0.079 μm in a particle size per 1 cm$^2$ on the main surface is as small as less than or equal to 20 particles/cm$^2$. The meaning of particles, the evaluation of the number of particles per 1 cm$^2$ on the main surface, the meaning of the defect and the evaluation thereof, and the meaning of the epitaxial layer are the same as in the case of the group III-V compound semiconductor substrate according to Embodiment 1, and the descriptions will not be thus repeated.

The present inventors examined various properties of the main surface of the InP substrate, required for reducing the LPD on the main surface of the epitaxial layer disposed on the main surface of the InP substrate. As shown in FIGS. 4 to 6, it has been found that there is a positive correlation between the number of particles of greater than or equal to 0.079 μm in particle size per unit area on the main surface of the InP substrate and the number of LPDs of greater than or equal to 0.136 μm in circle-equivalent diameter per unit area on the main surface in a case where the epitaxial layer disposed on the main surface of the InP substrate has a thickness of 0.3 m. Furthermore, the number of particles of greater than or equal to 0.079 μm in particle size per 1 cm$^2$ on the main surface of the InP substrate is adjusted to less than or equal to 20 particles/cm$^2$ (preferably less than or equal to 15 particles/cm$^2$), thereby making it possible to reduce the number of LPDs of greater than or equal to 0.136 μm in circle-equivalent diameter per 1 cm$^2$ on the main surface in a case where the epitaxial layer disposed on the InP substrate has a thickness of 0.3 μm, to less than or equal to 30 particles/cm$^2$ (preferably less than or equal to 20 particles/cm$^2$ or less). Further, it is assumed from the conventional experience that as LPDs of the epitaxial layer are reduced, the semiconductor device is less deteriorated. In this way, the invention of the present embodiment has been achieved.

In this regard, the particle size of the particle on the main surface of the InP substrate means the diameter of a circle that is equal in area to a particle measured as an LPD. In addition, the circle-equivalent diameter of the LPD on the main surface of the epitaxial layer means the diameter of a circle that is equal in area to an LPD measured.

In addition, the number of particles of greater than or equal to 0.079 μm in particle size on the main surface of the InP substrate and the number of LPDs of greater than or equal to 0.136 μm in circle-equivalent diameter per 1 cm$^2$ on the main surface of the epitaxial layer are measured with the use of a semiconductor laser with a wavelength of 405 nm as a light source of the light collecting lamp mentioned above. Examples of the measuring apparatus include WM-10 manufactured by TOPCON CORPORATION.

In this regard, for the InP substrate according to Embodiment 1, the number of particles of greater than or equal to 0.19 μm in particle size on the main surface per 1 cm$^2$ is evaluated with the use of an argon ion laser with a wavelength of 488 nm. In contrast, for the InP substrate according to Embodiment 2, the number of particles of greater than or equal to 0.079 μm in particle size on the main surface per 1 cm$^2$ is evaluated with the use of a semiconductor laser with a wavelength of 405 nm. More specifically, for the InP substrate according to Embodiment 2, as compared with the InP substrate according to Embodiment 1, particles that are smaller in particle size are also evaluated, and the cleanliness of the main surface of the substrate is thus more precisely evaluated.

In addition, with reference to FIG. 7, the particles of greater than or equal to 0.079 μm in particle size on the main surface of the InP substrate that is the group III-V compound semiconductor substrate are, from the viewpoint of uniformly reducing defects of the epitaxial layer disposed on the main surface of the InP substrate, distributed concentrically on the main surface, the distribution thereof is increased at the outer periphery of the substrate, and the proportion of the number of particles present at an outer periphery P2 to the number of particles present over the entire main surface (an inner periphery P1 and outer periphery P2) is preferably greater than or equal to 50%, more preferably greater than or equal to 70%. In this regard, inner periphery P1 of the main surface refers to a circular part at the center, outer periphery P2 thereof refers to an annular part surrounding the inner periphery, and the area of inner periphery P1 is equal to the area of outer periphery P2. In addition, the fact that the particles are distributed concentrically on the main surface means that the existence probabilities of particles are equal on concentric circles of the main surface.

The InP substrate according to the present embodiment may have impurity atoms added in the substrate. More specifically, the InP substrate may be a semi-insulating InP substrate with Fe (iron) atoms added for lowering the conductivity, or a conductive InP substrate with S (sulfur) atoms and/or Sn (tin) atoms added for increasing the conductivity.

For the semi-insulating InP substrate of the InP substrate according to the present embodiment, the main surface is preferably with a protective film. Thus, the adhesion of particles and/or impurity atoms to the main surface is suppressed, thereby keeping the main surface clean.

The protective film is not particularly limited, but preferably includes a surfactant from the viewpoint of the main surface further kept clean by further suppressing the adhesion of particles and/or impurity atoms to the surface. In this regard, the surfactant is not particularly limited, but preferably a nonionic surfactant from the viewpoint of the main surface further kept clean by further suppressing the adhesion of particles and/or impurity atoms to the surface. Suitable examples of the nonionic surfactant include higher alcohol type or alkylphenol type surfactants such as polyoxyalkylene alkyl ether, polyoxyethylene alkyl ether, and polyoxyethylene alkylphenyl ether; and fatty acid type surfactants such as sucrose fatty acid salt/ester, sorbitan fatty acid ester, polyoxyethylene sorbitan fatty acid ester, polyoxyethylene fatty acid ester, and alkanol amide; that have a molecular weight from 700 to 2000.

The thickness of the protective film is preferably greater than or equal to 0.3 nm, more preferably greater than or equal to 0.5 nm, from the viewpoint of the main surface further kept clean by the protective film that further suppresses the adhesion of particles and/or impurity atoms to the main surface. In addition, from the viewpoint of suppressing clouding of the main surface, the thickness is preferably less than or equal to 3 nm, more preferably less than or equal to 2 nm. The thickness of the protective film is measured by ellipsometry (SE-101 manufactured by Photonic Lattice Inc.).

For the semi-insulating InP substrate of the InP substrate according to the present embodiment, the main surface thereof is coated with the protective film, thereby making it possible to reduce defects of the epitaxial layer disposed on the main surface of the semi-insulating InP substrate, even after the storage of the semi-insulating InP substrate for 1 year. In this regard, the protective film evaporates in the temperature rising process before epitaxial growth, and does not remain on the surface before epitaxial growth.

The semi-insulating InP substrate of the InP substrate according to the present embodiment includes particles of greater than or equal to 0.079 μm in particle size at less than or equal to 20 particles/cm² on the main surface, the main surface is preferably coated with a protective film, and the protective film may include a surfactant, and have a thickness of greater than or equal to 0.3 nm and less than or equal to 3 nm. This aspect can further reduce defects of an epitaxial layer disposed on the main surface of the InP substrate that is the semi-insulting InP substrate.

<Method for Manufacturing Group III-V Compound Semiconductor Substrate>

With reference to FIG. 8, the method for manufacturing the InP substrate that is the group III-V compound semiconductor substrate according to the present embodiment is not particularly limited, but from the viewpoint of efficiently manufacturing the InP substrate according to the present embodiment, the method preferably includes a processing step S10 of forming an InP substrate (indium phosphide substrate) by processing an InP (indium phosphide) crystalline body, a polishing step S20 of polishing the InP substrate, a rough cleaning step S30 of roughly cleaning the polished InP substrate, and a precision cleaning step S40 of precisely cleaning the roughly cleaned InP substrate. The precision cleaning step S40 preferably includes a sulfuric acid/hydrogen peroxide mixture cleaning step S41 of cleaning the roughly cleaned InP substrate with a sulfuric acid/hydrogen peroxide mixture, a phosphoric acid cleaning step S42 of cleaning, with a phosphoric acid, the InP substrate cleaned with the sulfuric acid/hydrogen peroxide mixture, and a drying step S43 of drying the InP substrate cleaned with the phosphoric acid. The method for manufacturing the semi-insulating InP substrate of the InP substrate according to the present embodiment preferably further includes a protective film forming step S50 of forming a protective film coating the main surface of the semi-insulating InP substrate. The formation of the protective film coating the main surface of the semi-insulating InP substrate makes it possible to keep the main surface of the semi-insulating InP substrate clean.

The processing step, the polishing step, the rough cleaning step, and the precision cleaning step in the method for manufacturing the InP substrate according to the present embodiment are respectively the same as the processing step, the polishing step, the rough cleaning step, and the precision cleaning step in the method for manufacturing the InP substrate according to Embodiment 1, and the descriptions will not be thus repeated. In addition, the method for forming the protective film in the method for manufacturing the semi-insulating InP substrate of the InP substrate according to the present embodiment is also the same as the method for forming the protective film in the method for manufacturing the semi-insulating InP substrate of the InP substrate according to Embodiment 1, and the description will not be thus repeated.

Embodiment 3

<Epitaxial Layer-Attached Group III-V Compound Semiconductor Substrate>

An epilayer (epitaxial layer)-attached group III-V compound semiconductor substrate according to the present embodiment includes the group III-V compound semiconductor substrate (i.e., InP substrate) according to Embodiment 1, and an epitaxial layer disposed on the main surface of the group III-V compound semiconductor substrate, and includes LPDs (light point defects) of greater than or equal to 0.24 μm in circle-equivalent diameter at less than or equal to 10 defects/cm² (preferably less than or equal to 6 defects/cm²) on the main surface in a case where the epitaxial layer has a thickness of 0.3 μm. The epilayer-attached group III-V compound semiconductor substrate (that is, the epilayer-attached InP substrate) according to the present embodiment is an epilayer-attached InP substrate including a less defective epitaxial layer, and capable of manufacturing a high-performance semiconductor device.

For the epilayer-attached InP substrate according to the present embodiment, the epitaxial layer disposed on the main surface of the InP substrate is not particularly limited, but from the viewpoint of the ability to cause a high-quality epitaxial layer to grow, preferably a group III-V compound semiconductor layer. Suitable examples of the group III-V compound semiconductor layer include a compound semiconductor layer of a Group 13 element such as Al (aluminum), Ga (gallium), or In (indium) and a Group 15 element such as N (nitrogen), P (phosphorus), or As (arsenic), and include, for example, an InP layer and an $In_xGa_{1-x}As_yP_{1-y}$ layer ($0 \leq x < 1$, $0 < y \leq 1$).

For the epitaxial InP substrate according to the present embodiment, the method for disposing the epitaxial layer on the main surface of the InP substrate by causing the epitaxial layer to grow thereon is not particularly limited, but from the viewpoint of causing a high-quality epitaxial layer to grow, suitable examples include a liquid epitaxial growth (LPE) method, and a vapor phase epitaxial growth (VPE) method. Suitable examples of the VPE method include a hydride VPE method, a metal organic vapor phase epitaxial (MOVPE) method, and a molecular beam epitaxial growth (MBE) method.

Embodiment 4

<Epitaxial Layer-Attached Group III-V Compound Semiconductor Substrate>

An epilayer (epitaxial layer)-attached group III-V compound semiconductor substrate according to the present embodiment includes the group III-V compound semiconductor substrate (i.e., InP substrate) according to Embodiment 2, and an epitaxial layer disposed on the main surface of the group III-V compound semiconductor substrate, and includes LPDs (light point defects) of greater than or equal to 0.136 μm in circle-equivalent diameter at less than or equal to 30 defects/cm² (preferably less than or equal to 20 defects/cm²) on the main surface in a case where the epitaxial layer has a thickness of 0.3 μm. The epilayer-attached group III-V compound semiconductor substrate (that is, the epilayer-attached InP substrate) according to the present embodiment is an epilayer-attached InP substrate including a less defective epitaxial layer, and capable of manufacturing a high-performance semiconductor device.

For the epilayer-attached InP substrate according to the present embodiment, the epitaxial layer disposed on the main surface of the InP substrate is not particularly limited, but from the viewpoint of the ability to cause a high-quality epitaxial layer to grow, preferably a group III-V compound semiconductor layer. Suitable examples of the group III-V compound semiconductor layer include a compound semiconductor layer of a Group 13 element such as Al (aluminum), Ga (gallium), or In (indium) and a Group 15 element such as N (nitrogen), P (phosphorus), or As (arsenic), and include, for example, an InP layer and an $In_xGa_{1-x}As_yP_{1-y}$ layer ($0 \le x < 1$, $0 < y \le 1$).

For the epilayer-attached InP substrate according to the present embodiment, the method for disposing the epitaxial layer on the main surface of the InP substrate by causing the epitaxial layer to grow thereon is the same as in the case of the case of the epilayer-attached InP substrate according to Embodiment 4, and the description will not be thus repeated.

Embodiment 5

<Group III-V Compound Semiconductor Substrate>

The group III-V compound semiconductor substrate according to the present embodiment is a conductive GaAs substrate (conductive gallium arsenide substrate), including particles of greater than or equal to 0.079 μm in particle size at less than or equal to 1.0 particle/cm², preferably less than or equal to 0.6 particles/cm² on a main surface. The conductive GaAs substrate that is the group III-V compound semiconductor substrate according to the present embodiment can reduce defects of an epitaxial layer disposed on the main surface of the conductive GaAs substrate, because the number of particles of greater than or equal to 0.079 μm in a particle size per 1 cm² on the main surface is as small as less than or equal to 1.0 particle/cm². In this regard, the conductive GaAs substrate refers to a GaAs substrate that has a specific resistance of less than or equal to 1 Ω·cm. In addition, the conductive GaAs substrate encompasses an n-type GaAs substrate where carriers that transport charges are free electrons, and a p-type GaAs substrate where carriers that transport charges are holes. In addition, the meaning of particles, the evaluation of the number of particles per 1 cm² on the main surface, the meaning of the defect and the evaluation thereof, and the meaning of the epitaxial layer are the same as in the case of the group III-V compound semiconductor substrates according to Embodiments 1 and 2, and the descriptions will not be thus repeated.

Figure 11:
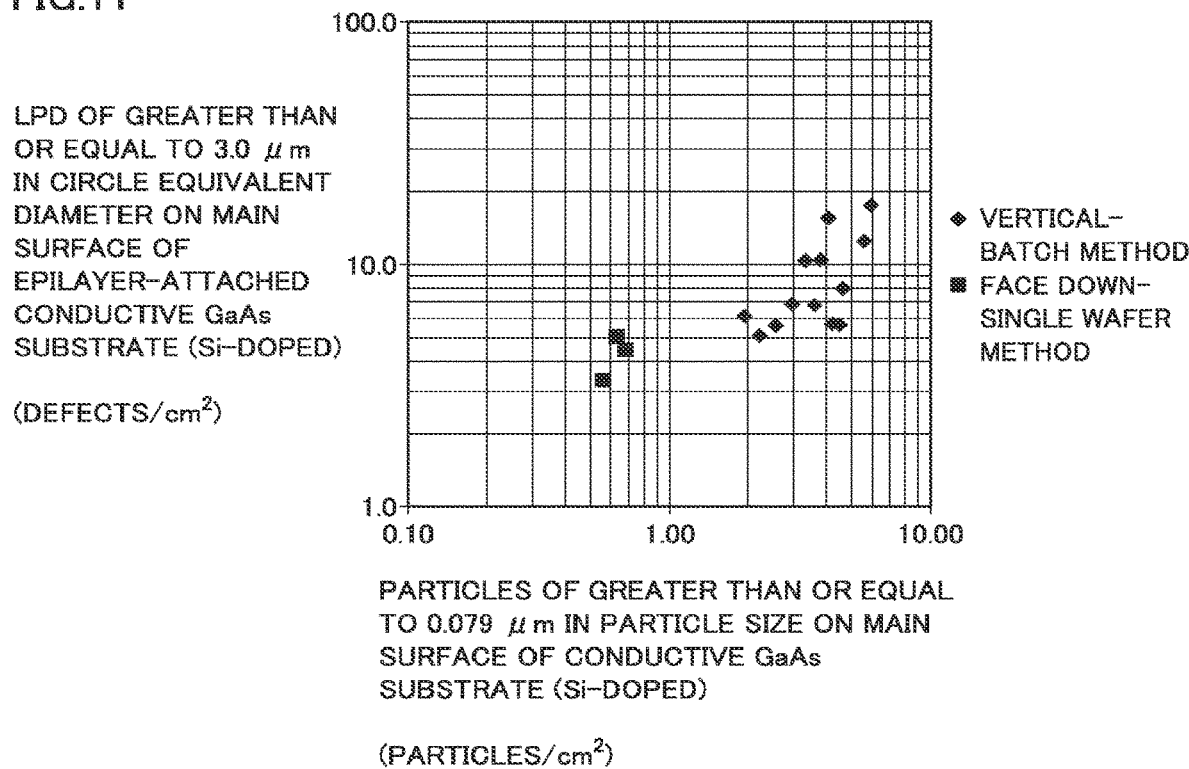
FIG. 11 is a graph showing an example of the relation between the number of particles of greater than or equal to 0.079 μm in circle-equivalent diameter per 1 cm² on the main surface of a conductive GaAs substrate and the number of LPDs of greater than or equal to 3.0 μm in circle-equivalent diameter per 1 cm² on the main surface of an epilayer of an epilayer-attached conductive GaAs substrate.

The inventors examined various properties of the main surface of the conductive GaAs substrate, required for reducing the LPD on the main surface of the epitaxial layer disposed on the main surface of the conductive GaAs substrate. As shown in FIG. 11, it has been found that there is a positive correlation between the number of particles of greater than or equal to 0.079 μm in particle size per unit area on the main surface of the conductive GaAs substrate and the number of LPDs of greater than or equal to 3.0 μm in circle-equivalent diameter per unit area on the main surface in a case where the epitaxial layer disposed on the main surface of the conductive GaAs substrate has a thickness of 5 μm. Furthermore, it has been found that the number of particles of greater than or equal to 0.079 μm in particle size per 1 cm² on the main surface of the conductive GaAs substrate is adjusted to less than or equal to 1.0 particle/cm² (preferably less than or equal to 0.6 particles/cm²), thereby making it possible to reduce the number of LPDs of greater than or equal to 3.0 μm in circle-equivalent diameter per 1 cm² on the main surface in a case where the epitaxial layer disposed on the conductive GaAs substrate has a thickness of 5 μm, to less than or equal to 5 particles/cm² (preferably less than or equal to 4 particles/cm² or less). Further, it is assumed from the conventional experience that as LPDs of the epitaxial layer are reduced, the semiconductor device is less deteriorated. In this way, the invention of the present embodiment has been achieved.

In this regard, the particle size of the particle on the main surface of the conductive GaAs substrate means the diameter of a circle that is equal in area to a particle measured as an LPD. In addition, the circle-equivalent diameter of the LPD on the main surface of the epitaxial layer means the diameter of a circle that is equal in area to an LPD measured.

In addition, the number of particles of greater than or equal to 0.079 μm in particle size per 1 cm² on the main surface of the conductive GaAs substrate is measured with the use of a semiconductor laser with a wavelength of 405 nm as a light source of the light collecting lamp mentioned above. Examples of the measuring apparatus include WM-10 manufactured by TOPCON CORPORATION. The number of LPDs of greater than or equal to 0.136 μm in circle-equivalent diameter per 1 cm² on the main surface of the epitaxial layer is measured with the use of a semiconductor laser with a wavelength of 405 nm or an argon ion laser with a wavelength of 488 nm as a light source of the light collecting lamp mentioned above. Examples of the measuring apparatus include WM-10 manufactured by TOPCON CORPORATION or Surfscan 6220 manufactured by Tencor Corporation.

Figure 10:
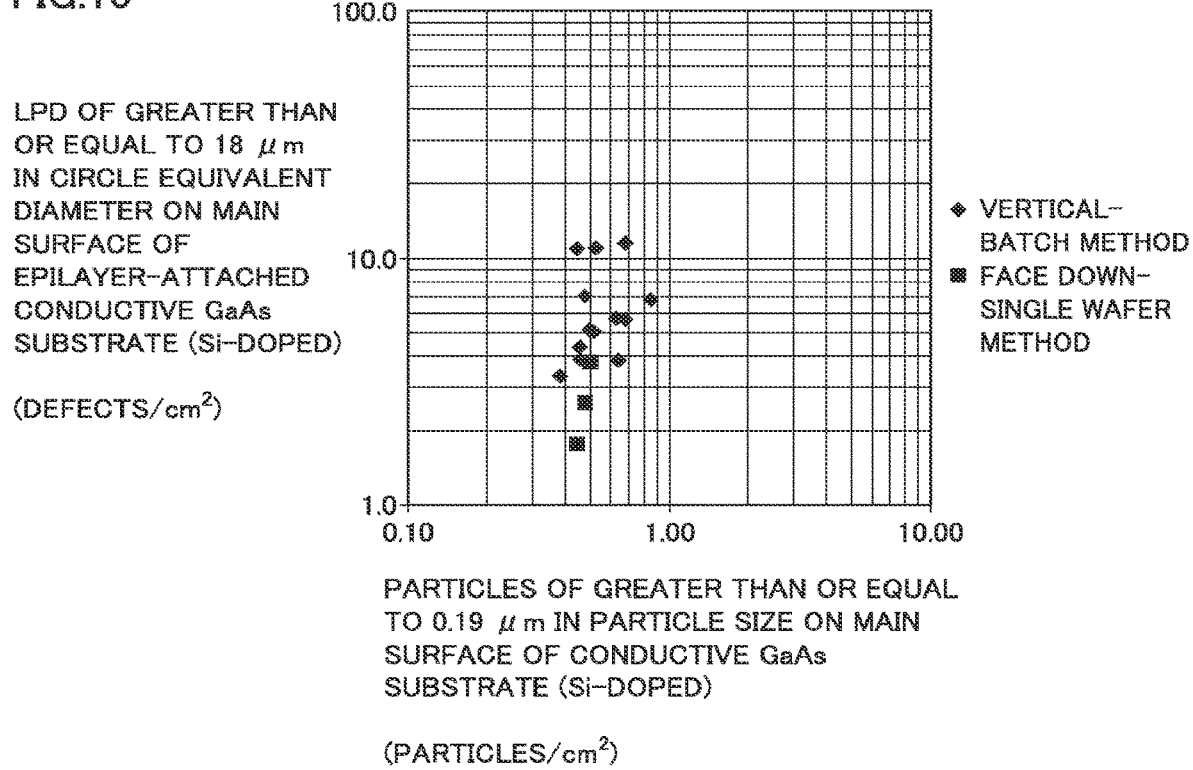
FIG. 10 is a graph showing an example of the relation between the number of particles of greater than or equal to 0.19 μm in circle-equivalent diameter per 1 cm² on the main surface of a conductive GaAs substrate and the number of LPDs of greater than or equal to 18 μm in circle-equivalent diameter per 1 cm² on the main surface of an epilayer of an epilayer-attached conductive GaAs substrate.

In this regard, as shown in FIG. 10, even when the conductive GaAs substrate is evaluated with the use of an argon ion laser with a wavelength of 488 nm for the relation between the number of particles of greater than or equal to 0.19 μm in particle size per unit area (1 cm²) on the main surface of the conductive GaAs substrate and the number of LPDs of greater than or equal to 18 μm in circle-equivalent diameter per unit area (1 cm²) on the main surface in a case where the epitaxial layer disposed on the main surface of the conductive GaAs substrate has a thickness of 5 µm, no correlation is found between the both numbers. More specifically, it is difficult to evaluate the cleanliness of the main surface of the conductive GaAs substrate by the method mentioned above.

In addition, with reference to FIG. 7, the particles of greater than or equal to 0.079 µm in particle size on the main surface of the conductive GaAs substrate that is the group III-V compound semiconductor substrate are, from the viewpoint of uniformly reducing defects of the epitaxial layer disposed on the main surface of the conductive GaAs substrate, distributed concentrically on the main surface, the distribution thereof is increased at the outer periphery of the substrate, and the proportion of the number of particles present at an outer periphery P2 to the number of particles present over the entire main surface (an inner periphery P1 and outer periphery P2) is preferably greater than or equal to 50%, more preferably greater than or equal to 70%. In this regard, inner periphery P1 of the main surface refers to a circular part at the center, outer periphery P2 thereof refers to an annular part surrounding the inner periphery, and the area of inner periphery P1 is equal to the area of outer periphery P2. In addition, the fact that the particles are distributed concentrically on the main surface means that the existence probabilities of particles are equal on concentric circles of the main surface.

The conductive GaAs substrate according to the present embodiment may have impurity atoms that impart conductivity, added in the substrate. The foregoing impurity atoms are not particularly limited, and examples thereof include Si (silicon) atoms and Te (tellurium) atoms as donor dopants that impart n-type conductivity, and include Zn (zinc) atoms as an acceptor dopant that imparts p-type conductivity.

<Method for Manufacturing Group III-V Compound Semiconductor Substrate>

Figure 14:
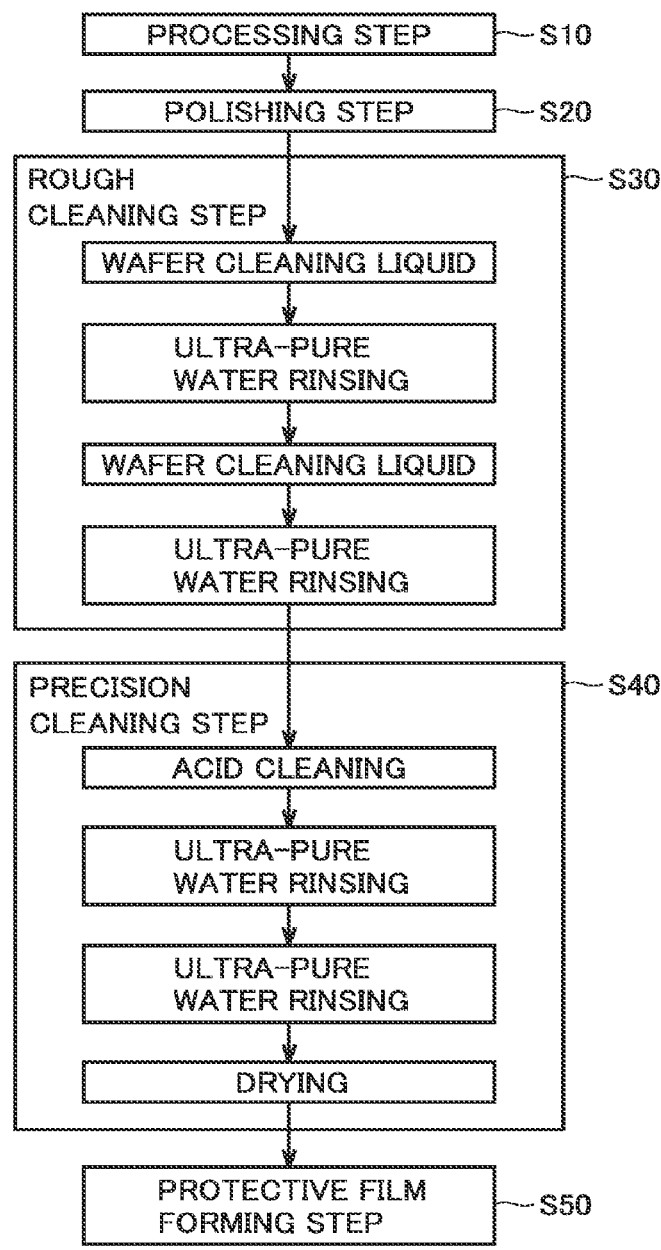
FIG. 14 is a flowchart showing an example of a method for manufacturing a conductive GaAs substrate and a semi-insulating GaAs substrate.

With reference to FIG. 14, the method for manufacturing the conductive GaAs substrate that is the group III-V compound semiconductor substrate according to the present embodiment is not particularly limited, but from the viewpoint of efficiently manufacturing the conductive GaAs substrate according to the present embodiment, the method preferably includes a processing step S10 of forming a conductive GaAs substrate by processing a conductive GaAs (n-type gallium arsenide) crystalline body, a polishing step S20 of polishing the conductive GaAs substrate, a rough cleaning step S30 of roughly cleaning the polished conductive GaAs substrate, and a precision cleaning step S40 of precisely cleaning the roughly cleaned conductive GaAs substrate. In this regard, rough cleaning step S30 preferably includes cleaning with a wafer cleaning liquid and cleaning by ultra-pure water rinsing. The precision cleaning step S40 preferably includes acid cleaning and cleaning by ultra-pure water rinsing.

(Processing Step)

First, in processing step S10, a conductive GaAs crystalline body is sliced and chamfered to form a conductive GaAs substrate. In this regard, the method for manufacturing the conductive GaAs crystalline body is not particularly limited, and a VB (vertical Bridgman) method, a VGF (vertical temperature gradient freezing) method, an LEC (liquid encapsulated Czochralski) method, or the like is suitably used.

(Polishing Step)

Next, in polishing step S20, the main surface of the conductive GaAs substrate is polished. The polishing method is not particularly limited, and mechanical polishing, mechanical chemical polishing (CMP), chemical polishing, or the like is suitably used.

(Rough Cleaning Step)

Next, in rough cleaning step S30, the conductive GaAs substrate with the main surface polished is roughly cleaned. In this regard, rough cleaning refers to cleaning with a wafer cleaning liquid and cleaning by ultra-pure water rinsing, for removing abrasives, polishing liquids, and the like attached to the main surface. In this regard, the ultra-pure water used for the ultra-pure rinsing refers to water that has an electric resistivity (specific resistance) of greater than or equal to 18 MΩ·cm, a TOC (total organic carbon) of less than 10 µg/L (liter), and a fine particle number of less than 100 particles/liter. In addition, the cleaning with a wafer cleaning liquid and the cleaning by ultra-pure water rinsing may be repeated more than once. In this regard, the wafer cleaning liquid is not particularly limited, but from the viewpoint of increasing the effect of cleaning the main surface of the conductive GaAs substrate, a tetramethylammonium hydroxide aqueous solution or the like is preferred.

(Precision Cleaning Step)

Next, in precision cleaning step S40, the conductive GaAs substrate with the main surface polished is precisely cleaned. In this regard, the precise leaning refers to acid cleaning, cleaning by ultra-pure water rinsing, and drying. The cleaning liquid used for the acid cleaning is not particularly limited, but from the viewpoint of increasing the effect of cleaning the main surface of the conductive GaAs substrate, an aqueous nitric acid solution or the like is preferred. In addition, the ultra-pure water used for the ultra-pure water rinsing is the same as ultra-pure water used for the ultrapure water rinsing in the rough cleaning process, and the description will not be thus repeated. In addition, the drying method is not particularly limited, but from the viewpoint of suppressing adhesion of particles to the main surface, a spin drying method, an IPA (isopropyl alcohol) vapor drying method, a hot air drying method, or the like is preferred.

With reference to FIG. 9, the cleaning method in precision cleaning step S40 is preferably a single wafer method. In particular, a face down-single wafer method is more preferred in which a main surface 10m to be cleaned is turned downward, and cleaned by a single wafer method. Specifically, with the use of a cleaning apparatus 20 including a holder 21 for holding the substrate, a cleaning liquid tank 23 located below the holder 21, and a chamber 25, the conductive GaAs substrate that is a group III-V compound semiconductor substrate 10 is fixed to holder 21 with main surface 10m to be cleaned facing downward, and while rotating III-V compound semiconductor substrate 10 by holder 21 and moving cleaning liquid tank 23, a cleaning liquid C is supplied to main surface 10m from the lower side thereof to clean main surface 10m. According to the cleaning method, because of the main surface 10m facing downward, the adhesion of particles descending from above can be prevented from being attached, and particles on main surface 10m can be remarkably reduced particles because the particles attached to main surface 10m fall by gravity without being attached again. The cleaning method makes it possible to adjust particles of greater than or equal to 0.079 µm in particle size on the main surface 10m of the conductive GaAs substrate that is the III-V compound semiconductor substrate 10, to less than or equal to 1.0 particles/cm², preferably less than or equal to 0.6 particles/cm².

In addition, with reference to FIG. 7, the particles of greater than or equal to 0.079 µm in particle size on the main surface 10m of conductive GaAs substrate that is group III-V compound semiconductor substrate 10 are distributed concentrically, the distribution thereof is increased at the outer periphery of the substrate, and the proportion of the number of particles present at an outer periphery P2 to the number of particles present over the entire main surface (an inner periphery P1 and outer periphery P2) is preferably greater than or equal to 50%, more preferably greater than or equal to 70%.

The conventional cleaning method in precision cleaning step S40 is a vertical-batch method of putting a plurality of conductive GaAs substrates in a cassette so that the main surfaces of the substrates are perpendicular to the horizontal plane, and immersing the cassette in a cleaning tank. The vertical-batch method has, because of a lot of contamination brought from the cassette and/or the conductive GaAs substrate, the problem of many particles on the main surface of the conductive GaAs substrate after the cleaning, and it is difficult to solve the problem.

The method for manufacturing the n-GaAs substrate according to the present embodiment includes processing step S10, polishing step S20, rough cleaning step S30, and precision cleaning step S40 mentioned above, thereby making it possible to efficiently manufacture the conductive GaAs substrate where particles on the main surface are reduced remarkably.

Embodiment 6

<Epitaxial Layer-Attached Group III-V Compound Semiconductor Substrate>

An epilayer (epitaxial layer)-attached group III-V compound semiconductor substrate according to the present embodiment includes the group III-V compound semiconductor substrate (i.e., conductive GaAs substrate) according to Embodiment 5, and an epitaxial layer disposed on the main surface of the group III-V compound semiconductor substrate, and includes LPDs (light point defects) of greater than or equal to 3.0 μm in circle-equivalent diameter at less than or equal to 5 defects/cm$^2$ (preferably less than or equal to 4 defects/cm$^2$) on the main surface in a case where the epitaxial layer has a thickness of 5 μm. The epilayer-attached group III-V compound semiconductor substrate (that is, the epilayer-attached conductive GaAs substrate) according to the present embodiment is an epilayer-attached conductive GaAs substrate including a less defective epitaxial layer, and capable of manufacturing a high-performance semiconductor device.

For the epilayer-attached conductive GaAs substrate according to the present embodiment, the epitaxial layer disposed on the main surface of the conductive GaAs substrate is not particularly limited, but from the viewpoint of the ability to cause a high-quality epitaxial layer to grow, preferably a group III-V compound semiconductor layer. Suitable examples of the group III-V compound semiconductor layer include a compound semiconductor layer of a Group 13 element such as Al (aluminum), Ga (gallium), or In (indium) and a Group 15 element such as N (nitrogen), P (phosphorus), or As (arsenic), and include, for example, a GaAs layer, an $Al_xGa_yIn_{1-x-y}As$ layer (0<x, 0<y, x+y<1), and an $Al_xGa_yIn_{1-x-y}As$ layer (0<x, 0<y<1, x+y≤1).

For the epilayer-attached conductive GaAs substrate according to the present embodiment, the method for disposing the epitaxial layer on the main surface of the conductive GaAs substrate by causing the epitaxial layer to grow thereon is the same as in the case of the case of the epilayer-attached InP substrate according to Embodiment 4, and the description will not be thus repeated.

Embodiment 7

An epilayer(epitaxial layer)-attached group III-V compound semiconductor substrate according to an aspect of the present embodiment includes a group III-V compound semiconductor substrate, and an epitaxial layer disposed on the main surface of the group III-V compound semiconductor substrate, and the group III-V compound semiconductor substrate is a semi-insulating GaAs substrate (semi-insulating gallium arsenide substrate) including particles of greater than or equal to 0.079 μm in particle size at less than or equal to 12 particles/cm$^2$ (preferably less than or equal to 10 particles/cm$^2$) on a main surface, and including light point defects of greater than or equal to 3.0 μm in circle-equivalent diameter at less than or equal to 10 defects/cm$^2$ (preferably less than or equal to 6 defects/cm$^2$) on the main surface in a case where the epitaxial layer has a thickness of 5 μm. This aspect provides an epilayer-attached group III compound semiconductor substrate (i.e., an epilayer-attached semi-insulating GaAs substrate) including a less defective epitaxial layer. The epilayer-attached group III-V compound semiconductor substrate (that is, the epilayer-attached semi-insulating GaAs substrate) according to the present embodiment is an epilayer-attached semi-insulating GaAs substrate including a less defective epitaxial layer, and capable of manufacturing a high-performance semiconductor device. In this regard, the semi-insulating GaAs substrate refers to, for example, a GaAs substrate that has a specific resistance of greater than or equal to $1 \times 10^7$ Ω·cm and less than or equal to $5 \times 10^8$ Ω·cm. In the case of the GaAs substrate, impurity atoms such as C (carbon) can also be added to ensure the semi-insulating property.

The inventors have found that the semi-insulating GaAs substrate that is the group III-V compound semiconductor substrate is cleaned by a face down-single wafer method as shown in FIG. 9 to adjust the number of particles of greater than or equal to 0.079 μm in particle size per 1 cm$^2$ on the main surface of the conductive GaAs substrate, to less than or equal to 12 particles/cm$^2$ (preferably less than or equal to 10 particles/cm$^2$), thereby making it possible to reduce the number of LPDs of greater than or equal to 3.0 μm in circle-equivalent diameter per 1 cm$^2$ on the main surface in a case where the epitaxial layer disposed on the semi-insulating GaAs substrate has a thickness of 5 μm, to less than or equal to 10 defects/cm$^2$ (preferably less than or equal to 6 defects/cm$^2$ or less). Further, it is assumed from the conventional experience that as LPDs of the epitaxial layer are reduced, the semiconductor device is less deteriorated. More specifically, the epilayer-attached group III-V compound semiconductor substrate (that is, the epilayer-attached semi-insulating GaAs substrate) according to the present embodiment is an epilayer-attached semi-insulating GaAs substrate including a less defective epitaxial layer, and capable of manufacturing a high-performance semiconductor device.

For the epilayer-attached semi-insulating GaAs substrate according to the present embodiment, the epitaxial layer disposed on the main surface of the semi-insulating GaAs substrate is not particularly limited, but from the viewpoint of the ability to cause a high-quality epitaxial layer to grow, preferably a group III-V compound semiconductor layer. Suitable examples of the group III-V compound semiconductor layer include a compound semiconductor layer of a Group 13 element such as Al (aluminum), Ga (gallium), or In (indium) and a Group 15 element such as N (nitrogen), P (phosphorus), or As (arsenic), and include, for example, a GaAs layer, an $Al_xGa_yIn_{1-x-y}P$ layer ($0<x$, $0<y$, $x+y<1$), and an $Al_xGa_yIn_{1-x-y}As$ layer ($0<x$, $0<y<1$, $x+y\le1$).

For the epilayer-attached semi-insulating GaAs substrate 5 according to the present embodiment, the method for disposing the epitaxial layer on the main surface of the semi-insulating GaAs substrate by causing the epitaxial layer to grow thereon is the same as in the case of the case of the epilayer-attached InP substrate according to Embodiment 4, and the description will not be thus repeated.

The method for manufacturing the semi-insulating GaAs substrate used in the manufacture of the epilayer-attached semi-insulating GaAs substrate according to the present embodiment is not particularly limited, but as with the method for manufacturing the conductive GaAs substrate according Embodiment 5, from the viewpoint of efficiently manufacturing the semi-insulating GaAs substrate according to the present embodiment, the method preferably includes a processing step S10 of forming a semi-insulating GaAs substrate by processing a semi-insulating GaAs (n-type gallium arsenide) crystalline body, a polishing step S20 of polishing the semi-insulating GaAs substrate, a rough cleaning step S30 of roughly cleaning the polished semi-insulating GaAs substrate, and a precision cleaning step S40 of precisely cleaning the roughly cleaned semi-insulating GaAs substrate. In this regard, rough cleaning step S30 preferably includes cleaning with a wafer cleaning liquid and cleaning by ultra-pure water rinsing. The precision cleaning step S40 preferably includes acid cleaning and cleaning by ultra-pure water rinsing. Processing step S10, polishing step S20, rough cleaning step S30, and precision cleaning step S40 in the method for manufacturing the semi-insulating GaAs substrate are respectively the same as processing step S10, polishing step S20, rough cleaning step S30, and precision cleaning step S40 in the method for manufacturing the conductive GaAs substrate according to Embodiment 5, and the descriptions will not be thus repeated.

In addition, the method for manufacturing the semi-insulating GaAs substrate preferably further includes a protective film forming step S50 of forming a protective film coating the main surface of the semi-insulating GaAs substrate. The formation of the protective film coating the main surface of the semi-insulating GaAs substrate makes it possible to keep the main surface of the semi-insulating GaAs substrate clean. More specifically, the main surface of the semi-insulating GaAs substrate is coated with the protective film, thereby making it possible to, even after storage for 1 year, reduce defects of the epitaxial layer disposed on the main surface of the semi-insulating GaAs substrate. In this regard, the protective film evaporates in the temperature rising process before epitaxial growth, and does not remain on the surface before epitaxial growth.

The method for forming the protective film is not particularly limited, but a method of immersing the semi-insulating GaAs substrate in a liquid for forming the protective film (for example, an aqueous solution containing a surfactant), and then spin-drying the substrate with the use of a normal batch-type cleaning apparatus, or a method of carrying out spin coating by supplying a liquid for forming the protective film to the main surface from the upper side of the main surface of the semi-insulating GaAs substrate while rotating the semi-insulating GaAs substrate, with the use of a normal single wafer-type cleaning apparatus is preferred as described in International Publication No. 2012/157476, from the viewpoint of efficiently forming a uniform protective film.

EXAMPLES

Examples, comparative examples, and reference examples will be described in detail with the following Experimental Examples I to XX. In this regard, Experimental Examples I to VI are considered to correspond to the group III-V compound semiconductor substrate (that is, the InP substrate) according to Embodiment 1 and the epilayer-attached group III-V compound semiconductor substrate (that is, the epilayer-attached InP substrate) according to Embodiment 3. In addition, Experimental Examples VII to XII are considered to correspond to the group III-V compound semiconductor substrate (that is, the InP substrate) according to Embodiment 2 and the epilayer-attached group III-V compound semiconductor substrate (that is, the epilayer-attached InP substrate) according to Embodiment 4. In addition, Experimental Examples XV and XVI are considered to correspond to the group III-V compound semiconductor substrate (that is, the conductive GaAs substrate) according to Embodiment 5 and the epilayer-attached group III-V compound semiconductor substrate (that is, the epilayer-attached conductive GaAs substrate) according to Embodiment 6. In addition, Experimental Examples XIX and XX are considered to correspond to the epilayer-attached group III-V compound semiconductor substrate (that is, the epilayer-attached semi-insulating GaAs substrate) according to Embodiment 7.

Experimental Example I

1. Processing

A semi-insulating InP crystalline body doped with Fe atoms, manufactured by the VB method is sliced and chamfered to prepare a plurality of semi-insulating InP substrates of 3 inches in diameter and 750 μm in thickness. For the prepared semi-insulating InP substrates, the specific resistance, as measured by a Hall measurement method, is $3\times10^7$ Ω·cm.

2. Polishing

The main surface of the processed semi-insulating InP substrate is polished by mechanical polishing and chemical mechanical polishing to a mirror surface where the arithmetic average roughness Ra of the main surface defined by JIS B0601: 2001 is less than or equal to 0.3 nm.

3. Rough Cleaning

The polished semi-insulating InP substrates are, in accordance with the vertical-batch method, cleaned with an alkaline solution by immersion in a 10% by mass choline aqueous solution at room temperature (25° C.) for 5 minutes, cleaned with a hydrofluoric acid solution by immersion in a 5% by mass hydrochloric acid aqueous solution at room temperature (25° C.) for 5 minutes, and further cleaned with an alkaline solution by immersion in a 5% by mass choline aqueous solution at room temperature (25° C.) for 5 minutes.

4. Precision Cleaning

The roughly cleaned semi-insulating InP substrates are cleaned precisely in accordance with the face down-single wafer method or the vertical-batch method. In regard to the face down-single wafer method, as Examples I-M1 to I-M3, precision cleaning is carried out by sulfuric acid/hydrogen peroxide mixture cleaning, ultra-pure water rinsing, phosphoric acid cleaning, and ultra-pure water rinsing with the use of the cleaning apparatus shown in FIG. 9. In the sulfuric acid/hydrogen peroxide mixture cleaning, at room temperature (25° C.), an aqueous solution containing 96% by mass sulfuric acid and 30% by mass hydrogen peroxide is supplied at 0.25 L (liter) for 1 minute to the main surface of the semi-insulating InP substrate; in the ultra-pure water rinsing, at room temperature (25° C.), ultra-pure water is supplied at 5 L (liter) for 5 minutes to the main surface of the semi-insulating InP substrate; in the phosphoric acid cleaning, at room temperature (25° C.), a 25% by mass phosphoric acid aqueous solution is supplied at 0.2 L (liter) for 1 minute to the main surface of the semi-insulating InP substrate; and in the ultra-pure water rinsing, at room temperature (25° C.), ultra-pure water is supplied at 5 L (liter) for 5 minutes to the main surface of the semi-insulating InP substrate. In regard to the vertical-batch method, as Examples I-B1 to I-B15, in the sulfuric acid/hydrogen peroxide mixture cleaning, at room temperature (25° C.), the main surface of the semi-insulating InP substrate is immersed for 2 minutes in 20 L of the aqueous solution containing 96% by mass sulfuric acid and 30% by mass hydrogen peroxide; in ultra-pure water rinsing, at room temperature (25° C.), ultra-pure water is supplied at 15 L (liter)/minute for 5 minutes to the main surface of the semi-insulating InP substrate; in phosphoric acid cleaning, the main surface of the semi-insulating InP substrate is immersed for 5 minutes in 20 L (liter) of a 25% by mass phosphoric acid aqueous solution; and in ultra-pure water rinsing, ultra-pure water is supplied at 15 L (liter)/minute for 5 minutes to the main surface of the semi-insulating InP substrate at room temperature (25° C.).

The number of particles of greater than or equal to 0.19 μm in particle size per 1 $cm^2$ in the part excluding an annular part of 3 mm from the outer edge on the main surface of the semi-insulating InP substrate after the precision cleaning is measured as LPDs (light point defects) under the conditions of Gain 4 and Throughput medium with the use of Surfscan 6220 (light source: an argon ion laser with a wavelength of 488 nm) manufactured by Tencor Corporation. Table 1 summarizes the number (particles/$cm^2$) of particles of greater than or equal to 0.19 μm in particle size per 1 $cm^2$ on the main surface of the semi-insulating InP substrate, and the proportion (%) of the number of particles of greater than or equal to 0.19 μm in particle size on the outer periphery to that on the main surface.

5. Growth of Epitaxial Layer

On the main surface of the semi-insulating InP substrate subjected to the precision cleaning, an InP layer with a thickness of 0.3 μm is grown as an epitaxial layer by the MOVPE method.

The number of LPDs (light point defects) of greater than or equal to 0.24 μm in circle-equivalent diameter per 1 $cm^2$ in the part excluding an annular part of 3 mm from the outer edge on the main surface of the epitaxial layer of the obtained epilayer-attached semi-insulating InP substrate is measured under the conditions of Gain 4 and Throughput medium with the use of Surfscan 6220 (light source: an argon ion laser with a wavelength of 488 nm) manufactured by Tencor Corporation. The results are summarized in Table 1. Furthermore, the relation between the number of particles of greater than or equal to 0.19 μm in particle size per 1 $cm^2$ on the main surface of the InP substrate and the number of LPDs (light point defects) of greater than or equal to 0.24 μm in circle-equivalent diameter per 1 $cm^2$ on the main surface of the epitaxial layer of the epilayer-attached InP substrate is plotted in FIG. 1.

TABLE 1

| Example | Cleaning Method | The number of particles of greater than or equal to 0.19 μm in particle size per 1 $cm^2$ on the main surface of semi-insulating InP substrate (Fe-doped) (particles/$cm^2$) | The proportion of the number of particles of greater than or equal to 0.19 μm in particle size on the outer periphery to that on the main surface of semi-insulating InP substrate (Fe-doped) (%) | The number of LPDs of greater than or equal to 0.24 μm in circle-equivalent diameter per 1 $cm^2$ on the main surface of the epilayer of the epilayer-attached semi-insulating InP substrate (Fe-doped) (particles/$cm^2$) | Remarks |
|---|---|---|---|---|---|
| Example I-M1 | Face down-single wafer method | 0.07 | 70 | 5.25 | Examples |
| Example I-M2 | Face down-single wafer method | 0.09 | 78 | 2.50 | Examples |
| Example I-M3 | Face down-single wafer method | 0.13 | 61 | 8.10 | Examples |
| Example I-B1 | Vertical-batch method | 0.33 | 45 | 14.8 | Comparative Example |
| Example I-B2 | Vertical-batch method | 0.80 | 35 | 16.8 | Comparative Example |
| Example I-B3 | Vertical-batch method | 1.80 | 47 | 51.2 | Comparative Example |
| Example I-B4 | Vertical-batch method | 1.52 | 39 | 38.2 | Comparative Example |
| Example I-B5 | Vertical-batch method | 0.40 | 29 | 11.4 | Comparative Example |
| Example I-B6 | Vertical-batch method | 1.21 | 48 | 47.6 | Comparative Example |
| Example I-B7 | Vertical-batch method | 0.34 | 34 | 11.0 | Comparative Example |
| Example I-B8 | Vertical-batch method | 0.25 | 42 | 10.8 | Comparative Example |
| Example I-B9 | Vertical-batch method | 0.52 | 41 | 15.3 | Comparative Example |
| Example I-B10 | Vertical-batch method | 0.88 | 46 | 26.4 | Comparative Example |
| Example I-B11 | Vertical-batch method | 0.99 | 39 | 13.1 | Comparative Example |

TABLE 1-continued

| Example | Cleaning Method | The number of particles of greater than or equal to 0.19 μm in particle size per 1 cm² on the main surface of semi-insulating InP substrate (Fe-doped) (particles/cm²) | The proportion of the number of particles of greater than or equal to 0.19 μm in particle size on the outer periphery to that on the main surface of semi-insulating InP substrate (Fe-doped) (%) | The number of LPDs of greater than or equal to 0.24 μm in circle-equivalent diameter per 1 cm² on the main surface of the epilayer of the epilayer-attached semi-insulating InP substrate (Fe-doped) (particles/cm²) | Remarks |
|---|---|---|---|---|---|
| Example I-B12 | Vertical-batch method | 0.54 | 38 | 19.1 | Comparative Example |
| Example I-B13 | Vertical-batch method | 1.76 | 30 | 65.7 | Comparative Example |

With reference to Table 1 and FIG. 1, changing the precision cleaning from the vertical-batch method to the face down-single wafer method makes it possible to reduce particles of greater than or equal to 0.19 μm in particle size on the main surface of the semi-insulating InP substrate, and as a result, reduce LPDs of greater than or equal to 0.24 μm in circle-equivalent diameter on the main surface of the epitaxial layer of the epilayer-attached semi-insulating InP substrate. In addition, the adjustment of particles of greater than or equal to 0.19 μm in particle size on the main surface of the semi-insulating InP substrate to less than or equal to 0.22 particles/cm², makes it possible to reduce LPDs of greater than or equal to 0.24 μm in circle-equivalent diameter on the main surface in a case where the epitaxial layer of the epilayer-attached semi-insulating InP substrate has a thickness of 0.3 μm, to less than or equal to 10 defects/cm².

Experimental Example II

For the semi-insulating InP substrates prepared in the same way as Examples I-M1 to I-M3 of Experiment Example I, the number of particles of greater than or equal to 0.19 μm in particle size per 1 cm² on the main surface is measured in the same way as in Experiment Example I.

1. Formation of Protective Film

As described in International Publication No. 2012/157476, with the use of a normal single wafer-type cleaning apparatus, while rotating the semi-insulating InP substrate obtained, an aqueous solution of 0.08% by mass NCW 1001 manufactured by Wako Pure Chemical Industries, Ltd. is supplied for spin coating as a liquid containing a surfactant onto the main surface from the upper side of the main surface of the semi-insulating InP substrate, thereby forming a protective film of 1.5 nm in thickness. The thickness of the protective film is measured by ellipsometry (SE-101 manufactured by Photonic Lattice Inc.).

2. 1 Year Storage

The semi-insulating InP substrate with the main surface coated with the protective film is put in a single-wafer tray (manufactured by Entegris, Inc.), put in an aluminum gusset bag, subjected to vacuuming, and then charged with nitrogen, and furthermore, this aluminum gusset bag is put in another aluminum gusset bag, subjected to vacuuming, and then stored for 1 year with the bag charged with nitrogen.

3. Growth of Epitaxial Layer

On the main surface of the semi-insulating InP substrate coated with the protective film after the storage for 1 year, an InP layer of 0.3 μm in thickness is grown as an epitaxial layer in the same way as in Experimental Example I.

The number of LPDs (light point defects) of greater than or equal to 0.24 μm in circle-equivalent diameter per 1 cm² in the part excluding an annular part of 3 mm from the outer edge on the main surface of the epitaxial layer of the obtained epilayer-attached semi-insulating InP substrate is measured under the conditions of Gain 4 and Throughput medium with the use of Surfscan 6220 manufactured by Tencor Corporation.

With respect to the obtained epilayer-attached semi-insulating InP substrate, particles of greater than or equal to 0.19 μm in particle size on the main surface of the semi-insulating InP substrate before the storage for 1 year correspond to 0.08 particles/cm² (that is, less than or equal to 0.22 particles/cm²), and LPDs of greater than or equal to 0.24 μm in circle-equivalent diameter on the epitaxial layer of 0.3 μm in thickness, grown on the main surface of the semi-insulating InP substrate after the storage for 1 year correspond to 3.40 defects/cm² (that is, less than or equal to 10 defects/cm²). As just described, coating the main surface of the semi-insulating InP substrate with the protective film in this manner makes it possible to, even after the storage for 1 year, cause the less defective epitaxial layer to grow on the main surface of the semi-insulating InP substrate, coated with the protective film.

Experimental Example III

A conductive InP crystalline body doped with S atoms, manufactured by the VB method is sliced and chamfered to prepare a plurality of conductive InP substrates of 3 inches in diameter and 750 μm in thickness. For the prepared conductive InP substrates, the specific resistance, as measured by a Hall measurement method, is $1 \times 10^{-3}$ Ω·cm.

The main surfaces of the processed conductive InP substrates are polished and subjected to rough cleaning and precision cleaning in the same way as in Experiment Example I, and then, an InP layer (epitaxial layer) with a thickness of 0.3 μm is grown on the main surfaces. Table 2 summarizes, in the same manner as in Experimental Example I, the number (particles/cm²) of particles of greater than or equal to 0.19 μm in particle size per 1 cm² on the main surface of the conductive InP substrate, the proportion (%) of the number of particles of greater than or equal to 0.19 μm in particle size on the outer periphery to that on the main surface, and the number (defects/cm²) of LPDs of greater than or equal to 0.24 μm in circle-equivalent diameter per 1 cm² on the main surface of the epitaxial layer. Furthermore, the relation between the number of particles of greater than or equal to 0.19 μm in particle size per 1 cm² on the main surface of the conductive InP substrate and the number of LPDs of greater than or equal to 0.24 μm in circle-equivalent diameter per 1 cm² on the main surface of the epitaxial layer of the epilayer-attached InP substrate is plotted in FIG. 2.

TABLE 2

| Example | Cleaning Method | The number of particles of greater than or equal to 0.19 μm in particle size per 1 cm² on the main surface of conductive InP substrate (S-doped) (particles/cm²) | The proportion of the number of particles of greater than or equal to 0.19 μm in particle size on the outer periphery to that on the main surface of conductive InP substrate (S-doped) (%) | The number of LPDs of greater than or equal to 0.24 μm in circle-equivalent diameter per 1 cm² on the main surface of the epilayer of the epilayer-attached conductive InP substrate (S-doped) (particles/cm²) | Remarks |
|---|---|---|---|---|---|
| Example III-M1 | Face down-single wafer method | 0.02 | 62 | 1.50 | Examples |
| Example III-M2 | Face down-single wafer method | 0.04 | 74 | 4.10 | Examples |
| Example III-M3 | Face down-single wafer method | 0.11 | 65 | 5.30 | Examples |
| Example III-B1 | Vertical-batch method | 0.36 | 30 | 18.8 | Comparative Example |
| Example III-B2 | Vertical-batch method | 0.50 | 29 | 12.9 | Comparative Example |
| Example III-B3 | Vertical-batch method | 1.90 | 35 | 65.2 | Comparative Example |
| Example III-B4 | Vertical-batch method | 1.29 | 44 | 41.5 | Comparative Example |
| Example III-B5 | Vertical-batch method | 0.39 | 44 | 11.9 | Comparative Example |
| Example III-B6 | Vertical-batch method | 1.29 | 31 | 25.0 | Comparative Example |
| Example III-B7 | Vertical-batch method | 0.31 | 31 | 10.4 | Comparative Example |
| Example III-B8 | Vertical-batch method | 0.81 | 44 | 22.0 | Comparative Example |
| Example III-B9 | Vertical-batch method | 0.59 | 39 | 12.9 | Comparative Example |
| Example III-B10 | Vertical-batch method | 0.78 | 36 | 24.5 | Comparative Example |
| Example III-B11 | Vertical-batch method | 0.88 | 42 | 22.0 | Comparative Example |
| Example III-B12 | Vertical-batch method | 0.41 | 33 | 27.0 | Comparative Example |
| Example III-B13 | Vertical-batch method | 0.80 | 39 | 38.0 | Comparative Example |

With reference to Table 2 and FIG. 2, changing the precision cleaning from the vertical-batch method to the face down-single wafer method makes it possible to reduce particles of greater than or equal to 0.19 μm in particle size on the main surface of the conductive InP substrate, and as a result, reduce LPDs of greater than or equal to 0.24 μm in circle-equivalent diameter on the main surface of the epitaxial layer of the epilayer-attached conductive InP substrate. In addition, the adjustment of particles of greater than or equal to 0.19 μm in particle size on the main surface of the conductive InP substrate to less than or equal to 0.22 particles/cm², makes it possible to reduce LPDs of greater than or equal to 0.24 μm in circle-equivalent diameter on the main surface in a case where the epitaxial layer of the epilayer-attached conductive InP substrate has a thickness of 0.3 μm, to less than or equal to 10 defects/cm².

Experimental Example IV

A conductive InP crystalline body doped with Sn atoms, manufactured by the VB method is sliced and chamfered to prepare a plurality of n-type conductive InP substrates of 3 inches in diameter and 750 μm in thickness. For the prepared conductive InP substrates, the specific resistance, as measured by a Hall measurement method, is $2 \times 10^{-3}$ Ω·cm.

The main surfaces of the processed conductive InP substrates are polished and subjected to rough cleaning and precision cleaning in the same way as in Experiment Example I, and then, an InP layer (epitaxial layer) with a thickness of 0.3 μm is grown on the main surfaces. Table 3 summarizes, in the same manner as in Experimental Example I, the number (particles/cm²) of particles of greater than or equal to 0.19 μm in particle size per 1 cm² on the main surface of the conductive InP substrate, the proportion (%) of the number of particles on the outer periphery to that on the main surface, and the number (defects/cm²) of LPDs of greater than or equal to 0.24 μm in circle-equivalent diameter per 1 cm² on the main surface of the epitaxial layer. Furthermore, the relation between the number of particles of greater than or equal to 0.19 μm in particle size per 1 cm² on the main surface of the InP substrate and the number of LPDs of greater than or equal to 0.24 μm in circle-equivalent diameter per 1 cm² on the main surface of the epitaxial layer of the epilayer-attached conductive InP substrate is plotted in FIG. 3.

TABLE 3

| Example | Cleaning Method | The number of particles of greater than or equal to 0.19 μm in particle size per 1 cm² on the main surface of conductive InP substrate (Sn-doped) (particles/cm²) | The proportion of the number of particles of greater than or equal to 0.19 μm in particle size on the outer periphery to that on the main surface of conductive InP substrate (Sn-doped) (%) | The number of LPDs of greater than or equal to 0.24 μm in circle-equivalent diameter per 1 cm² on the main surface of the epilayer of the epilayer-attached conductive InP substrate (Sn-doped) (particles/cm²) | Remarks |
|---|---|---|---|---|---|
| Example IV-M1 | Face down-single wafer method | 0.02 | 71 | 1.80 | Examples |
| Example IV-M2 | Face down-single wafer method | 0.20 | 61 | 8.10 | Examples |
| Example IV-M3 | Face down-single wafer method | 0.16 | 78 | 6.10 | Examples |
| Example IV-B1 | Vertical-batch method | 0.25 | 33 | 11.1 | Comparative Example |
| Example IV-B2 | Vertical-batch method | 0.30 | 42 | 13.0 | Comparative Example |
| Example IV-B3 | Vertical-batch method | 3.80 | 39 | 67.2 | Comparative Example |
| Example IV-B4 | Vertical-batch method | 2.20 | 43 | 41.2 | Comparative Example |
| Example IV-B5 | Vertical-batch method | 0.99 | 43 | 36.1 | Comparative Example |
| Example IV-B6 | Vertical-batch method | 2.90 | 48 | 44.3 | Comparative Example |
| Example IV-B7 | Vertical-batch method | 0.33 | 39 | 12.1 | Comparative Example |
| Example IV-B8 | Vertical-batch method | 1.14 | 38 | 21.4 | Comparative Example |
| Example IV-B9 | Vertical-batch method | 0.39 | 41 | 11.9 | Comparative Example |
| Example IV-B10 | Vertical-batch method | 1.38 | 46 | 22.4 | Comparative Example |
| Example IV-B11 | Vertical-batch method | 1.10 | 44 | 15.0 | Comparative Example |
| Example IV-B12 | Vertical-batch method | 0.99 | 31 | 21.1 | Comparative Example |
| Example IV-B13 | Vertical-batch method | 1.55 | 38 | 45.1 | Comparative Example |

With reference to Table 3 and FIG. 3, changing the precision cleaning from the vertical-batch method to the face down-single wafer method makes it possible to reduce particles of greater than or equal to 0.19 μm in particle size on the main surface of the conductive InP substrate, and as a result, reduce LPDs of greater than or equal to 0.24 μm in circle-equivalent diameter on the main surface of the epitaxial layer of the epilayer-attached conductive InP substrate. In addition, the adjustment of particles of greater than or equal to 0.19 μm in particle size on the main surface of the conductive InP substrate to less than or equal to 0.22 particles/cm², makes it possible to reduce LPDs of greater than or equal to 0.24 μm in circle-equivalent diameter on the main surface in a case where the epitaxial layer of the epilayer-attached conductive InP substrate has a thickness of 0.3 μm, to less than or equal to 10 defects/cm².

Experimental Example V

A semi-insulating InP crystalline body doped with Fe atoms, manufactured by the VB method is sliced and chamfered to prepare a plurality of semi-insulating InP substrates of 3 inches in diameter and 750 μm in thickness. For the prepared semi-insulating InP substrates, the specific resistance, as measured by a Hall measurement method, is $3 \times 10^7$ Ω·cm. The main surfaces of the processed semi-insulating InP substrates are polished and subjected to rough cleaning and precision cleaning in the same way as in Experiment Example I.

The number of particles of greater than or equal to 0.079 μm in particle size per 1 cm² in the part excluding an annular part of 3 mm from the outer edge on the main surface of the semi-insulating InP substrate after the precision cleaning is measured as LPDs (light point defects) under the conditions of the high incident mode and standard scan mode with the use of WM-10 (light source: a semiconductor laser with a wavelength of 405 nm) manufactured by TOPCON CORPORATION. Table 4 summarizes the number (particles/cm²) of particles of greater than or equal to 0.079 μm in particle size per 1 cm² on the main surface of the semi-insulating InP substrate, and the proportion (%) of the number of particles of greater than or equal to 0.079 μm in particle size on the outer periphery to that on the main surface.

On the main surface of the semi-insulating InP substrate subjected to the precision cleaning, an InP layer with a thickness of 0.3 μm is grown as an epitaxial layer by the MOVPE method. The number of LPDs (light point defects) of greater than or equal to 0.136 μm in circle-equivalent diameter per 1 cm² in the part excluding an annular part of 3 mm from the outer edge on the main surface of the epitaxial layer of the obtained epilayer-attached semi-insulating InP substrate is measured under the conditions of the high incident mode and standard scan mode with the use of WM-10 (light source: a semiconductor laser with a wavelength of 405 nm) manufactured by TOPCON CORPORATION. The results are summarized in Table 4. Furthermore, the relation between the number of particles of greater than or equal to 0.079 μm in particle size per 1 cm² on the main surface of the semi-insulating InP substrate and the number of LPDs (light point defects) of greater than or equal to 0.136 μm in circle-equivalent diameter per 1 cm² on the main surface of the epitaxial layer of the epilayer-attached semi-insulating InP substrate is plotted in FIG. 4.

Example V, the number of particles of greater than or equal to 0.079 μm in particle size per 1 cm² on the main surface is measured in the same way as in Experiment Example V. In the same way as in Experimental Example II, the semi-insulating InP substrates each with a protective film formed on the main surface is prepared, and stored for 1 year. On the

TABLE 4

| Example | Cleaning Method | The number of particles of greater than or equal to 0.079 μm in particle size per 1 cm² on the main surface of semi-insulating InP substrate (Fe-doped) (particles/cm²) | The proportion of the number of particles of greater than or equal to 0.079 μm in particle size on the outer periphery to that on the main surface of semi-insulating InP substrate (Fe-doped) (%) | The number of LPDs of greater than or equal to 0.136 μm in circle-equivalent diameter per 1 cm² on the main surface of the epilayer of the epilayer-attached semi-insulating InP substrate (Fe-doped) (particles/cm²) | Remarks |
|---|---|---|---|---|---|
| Example V-M1 | Face down-single wafer method | 6.79 | 70 | 18.4 | Examples |
| Example V-M2 | Face down-single wafer method | 8.73 | 78 | 8.75 | Examples |
| Example V-M3 | Face down-single wafer method | 12.6 | 61 | 28.4 | Examples |
| Example V-B1 | Vertical-batch method | 92.8 | 45 | 66.6 | Comparative Example |
| Example V-B2 | Vertical-batch method | 225 | 35 | 75.6 | Comparative Example |
| Example V-B3 | Vertical-batch method | 506 | 47 | 230 | Comparative Example |
| Example V-B4 | Vertical-batch method | 428 | 39 | 172 | Comparative Example |
| Example V-B5 | Vertical-batch method | 113 | 29 | 51.3 | Comparative Example |
| Example V-B6 | Vertical-batch method | 340 | 48 | 214 | Comparative Example |
| Example V-B7 | Vertical-batch method | 95.6 | 34 | 49.5 | Comparative Example |
| Example V-B8 | Vertical-batch method | 70.3 | 42 | 48.6 | Comparative Example |
| Example V-B9 | Vertical-batch method | 146 | 41 | 68.9 | Comparative Example |
| Example V-B10 | Vertical-batch method | 248 | 46 | 119 | Comparative Example |
| Example V-B11 | Vertical-batch method | 278 | 39 | 59.0 | Comparative Example |
| Example V-B12 | Vertical-batch method | 152 | 38 | 86.0 | Comparative Example |
| Example V-B13 | Vertical-batch method | 495 | 30 | 296 | Comparative Example |

With reference to Table 4 and FIG. 4, changing the precision cleaning from the vertical-batch method to the face down-single wafer method makes it possible to reduce particles of greater than or equal to 0.079 μm in particle size on the main surface of the semi-insulating InP substrate, and as a result, reduce LPDs of greater than or equal to 0.136 μm in circle-equivalent diameter on the main surface of the epitaxial layer of the epilayer-attached semi-insulating InP substrate. In addition, the adjustment of particles of greater than or equal to 0.079 μm in particle size on the main surface of the semi-insulating InP substrate to less than or equal to 20 particles/cm², makes it possible to reduce LPDs of greater than or equal to 0.136 μm in circle-equivalent diameter on the main surface in a case where the epitaxial layer of the epilayer-attached semi-insulating InP substrate has a thickness of 0.3 μm, to less than or equal to 30 defects/cm².

Experimental Example VI

For the semi-insulating InP substrates prepared in the same way as Examples V-M1 to V-M3 of Experiment Example V, the number of particles of greater than or equal to 0.079 μm in particle size per 1 cm² on the main surface is measured in the same way as in Experiment Example V. In the same way as in Experimental Example II, the semi-insulating InP substrates each with a protective film formed on the main surface is prepared, and stored for 1 year. On the main surface of the semi-insulating InP substrate coated with the protective film after the storage for 1 year, an InP layer of 0.3 μm in thickness is grown as an epitaxial layer in the same way as in Experimental Example II. The number of particles of greater than or equal to 0.079 μm in particle size per 1 cm² on the main surface of the semi-insulating InP substrate before the storage for 1 year and the number of LPDs of greater than or equal to 0.24 μm in circle-equivalent diameter per 1 cm² on the main surface of the epitaxial layer thereof are measured in the same way as in Experimental Example V.

With respect to the obtained epilayer-attached semi-insulating InP substrate, particles of greater than or equal to 0.079 μm in particle size on the main surface of the semi-insulating InP substrate before the storage for 1 year correspond to 6.80 particles/cm² (that is, less than or equal to 20 particles/cm²), and LPDs of greater than or equal to 0.136 μm in circle-equivalent diameter on the epitaxial layer of 0.3 μm in thickness, grown on the main surface of the semi-insulating InP substrate after the storage for 1 year correspond to 15.7 defects/cm² (that is, less than or equal to 30 defects/cm²). As just described, coating the main surface of the semi-insulating InP substrate with the protective film in this manner makes it possible to, even after the storage for 1 year, cause the less defective epitaxial layer to grow on the main surface of the semi-insulating InP substrate, coated with the protective film.

Experimental Example VII

A conductive InP crystalline body doped with S atoms, manufactured by the VB method is sliced and chamfered to prepare a plurality of conductive InP substrates of 3 inches in diameter and 750 μm in thickness. For the prepared InP substrates, the specific resistance, as measured by a Hall measurement method, is $1 \times 10^3$ Ω·cm.

The main surfaces of the processed conductive InP substrates are polished and subjected to rough cleaning and precision cleaning in the same way as in Experiment Example I, and then, an InP layer (epitaxial layer) with a thickness of 0.3 μm is grown on the main surfaces. Table 5 summarizes, in the same manner as in Experimental Example V, the number (particles/cm²) of particles of greater than or equal to 0.079 μm in particle size per 1 cm² on the main surface of the conductive InP substrate, the proportion (%) of the number of particles of greater than or equal to 0.079 μm in particle size on the outer periphery to that on the main surface, and the number (defects/cm²) of LPDs of greater than or equal to 0.136 μm in circle-equivalent diameter per 1 cm² on the main surface of the epitaxial layer. Furthermore, the relation between the number of particles of greater than or equal to 0.079 μm in particle size per 1 cm² on the main surface of the conductive InP substrate and the number of LPDs of greater than or equal to 0.136 μm in circle-equivalent diameter per 1 cm² on the main surface of the epitaxial layer of the epilayer-attached conductive InP substrate is plotted in FIG. 5.

TABLE 5

| Example | Cleaning Method | The number of particles of greater than or equal to 0.079 μm in particle size per 1 cm² on the main surface of conductive InP substrate (S-doped) (particles/cm²) | The proportion of the number of particles of greater than or equal to 0.079 μm in particle size on the outer periphery to that on the main surface of conductive InP substrate (S-doped) (%) | The number of LPDs of greater than or equal to 0.136 μm in circle-equivalent diameter per 1 cm² on the main surface of the epilayer of the epilayer-attached conductive InP substrate (D-doped) (particles/cm²) | Remarks |
|---|---|---|---|---|---|
| Example VII-M1 | Face down-single wafer method | 1.90 | 62 | 6.75 | Examples |
| Example VII-M2 | Face down-single wafer method | 3.80 | 74 | 18.5 | Examples |
| Example VII-M3 | Face down-single wafer method | 10.5 | 65 | 23.9 | Examples |
| Example VII-B1 | Vertical-batch method | 58.1 | 30 | 94.0 | Comparative Example |
| Example VII-B2 | Vertical-batch method | 80.8 | 29 | 64.5 | Comparative Example |
| Example VII-B3 | Vertical-batch method | 307 | 35 | 326 | Comparative Example |
| Example VII-B4 | Vertical-batch method | 208 | 44 | 208 | Comparative Example |
| Example VII-B5 | Vertical-batch method | 63.0 | 44 | 59.5 | Comparative Example |
| Example VII-B6 | Vertical-batch method | 208 | 31 | 125 | Comparative Example |
| Example VII-B7 | Vertical-batch method | 50.1 | 31 | 52.0 | Comparative Example |
| Example VII-B8 | Vertical-batch method | 131 | 44 | 110 | Comparative Example |
| Example VII-B9 | Vertical-batch method | 95.3 | 39 | 64.5 | Comparative Example |
| Example VII-B10 | Vertical-batch method | 126 | 36 | 123 | Comparative Example |
| Example VII-B11 | Vertical-batch method | 142 | 42 | 110 | Comparative Example |
| Example VII-B12 | Vertical-batch method | 66.2 | 33 | 135 | Comparative Example |
| Example VII-B13 | Vertical-batch method | 129 | 39 | 190 | Comparative Example |

With reference to Table 5 and FIG. 5, changing the precision cleaning from the vertical-batch method to the face down-single wafer method makes it possible to reduce particles of greater than or equal to 0.079 μm in particle size on the main surface of the conductive InP substrate, and as a result, reduce LPDs of greater than or equal to 0.136 μm in circle-equivalent diameter on the main surface of the epitaxial layer of the epilayer-attached conductive InP substrate. In addition, the adjustment of particles of greater than or equal to 0.079 μm in particle size on the main surface of the conductive InP substrate to less than or equal to 20 particles/cm², makes it possible to reduce LPDs of greater than or equal to 0.136 μm in circle-equivalent diameter on the main surface in a case where the epitaxial layer of the epilayer-attached conductive InP substrate has a thickness of 0.3 μm, to less than or equal to 30 defects/cm².

Experimental Example VIII

A conductive InP crystalline body doped with Sn atoms, manufactured by the VB method is sliced and chamfered to prepare a plurality of conductive InP substrates of 3 inches in diameter and 750 μm in thickness. For the prepared conductive InP substrates, the specific resistance, as measured by a Hall measurement method, is $2\times10^{-3}$ Ω·cm.

The main surfaces of the processed conductive InP substrates are polished and subjected to rough cleaning and precision cleaning in the same way as in Experiment Example I, and then, an InP layer (epitaxial layer) with a thickness of 0.3 μm is grown on the main surfaces. Table 6 summarizes, in the same manner as in Experimental Example V, the number (particles/cm$^2$) of particles of greater than or equal to 0.079 μm in particle size per 1 cm$^2$ on the main surface of the conductive InP substrate, the proportion (%) of the number of particles of greater than or equal to 0.079 μm in particle size on the outer periphery to that on the main surface, and the number (defects/cm$^2$) of LPDs of greater than or equal to 0.136 μm in circle-equivalent diameter per 1 cm$^2$ on the main surface of the epitaxial layer. Furthermore, the relation between the number of particles of greater than or equal to 0.079 μm in particle size per 1 cm$^2$ on the main surface of the conductive InP substrate and the number of LPDs of greater than or equal to 0.136 μm in circle-equivalent diameter per 1 cm$^2$ on the main surface of the epitaxial layer of the epilayer-attached conductive InP substrate is plotted in FIG. 6.

With reference to Table 6 and FIG. 6, changing the precision cleaning from the vertical-batch method to the face down-single wafer method makes it possible to reduce particles of greater than or equal to 0.079 μm in particle size on the main surface of the conductive InP substrate, and as a result, reduce LPDs of greater than or equal to 0.136 μm in circle-equivalent diameter on the main surface of the epitaxial layer of the epilayer-attached conductive InP substrate. In addition, the adjustment of particles of greater than or equal to 0.079 μm in particle size on the main surface of the conductive InP substrate to less than or equal to 20 particles/cm$^2$, makes it possible to reduce LPDs of greater than or equal to 0.136 μm in circle-equivalent diameter on the main surface in a case where the epitaxial layer of the epilayer-attached conductive InP substrate has a thickness of 0.3 μm, to less than or equal to 30 defects/cm$^2$.

Experimental Example IX

1. Processing

A conductive GaAs crystalline body doped with Si atoms, manufactured by the VB method is sliced and chamfered to prepare a plurality of conductive GaAs substrates of 6 inches in diameter and 750 μm in thickness. For the prepared conductive GaAs substrates, the specific resistance, as measured by a Hall measurement method, is $1\times10^{-3}$ Ω·cm.

2. Polishing

The main surface of the processed conductive GaAs substrate is polished by mechanical polishing and chemical

TABLE 6

| Example | Cleaning Method | The number of particles of greater than or equal to 0.079 μm in particle size per 1 cm$^2$ on the main surface of conductive InP substrate (Sn-doped) (particles/cm$^2$) | The proportion of the number of particles of greater than or equal to 0.079 μm in particle size on the outer periphery to that on the main surface of conductive InP substrate (Sn-doped) (%) | The number of LPDs of greater than or equal to 0.136 μm in circle-equivalent diameter per 1 cm$^2$ on the main surface of the epilayer of the epilayer-attached conductive InP substrate (Sn-doped) (particles/cm$^2$) | Remarks |
|---|---|---|---|---|---|
| Example VIII-M1 | Face down-single wafer method | 1.88 | 71 | 5.40 | Examples |
| Example VIII-M2 | Face down-single wafer method | 18.8 | 61 | 24.3 | Examples |
| Example VIII-M3 | Face down-single wafer method | 15.0 | 78 | 18.3 | Examples |
| Example VIII-B1 | Vertical-batch method | 56.4 | 33 | 44.4 | Comparative Example |
| Example VIII-B2 | Vertical-batch method | 67.7 | 42 | 52.0 | Comparative Example |
| Example VIII-B3 | Vertical-batch method | 857 | 39 | 269 | Comparative Example |
| Example VIII-B4 | Vertical-batch method | 496 | 43 | 165 | Comparative Example |
| Example VIII-B5 | Vertical-batch method | 223 | 43 | 144 | Comparative Example |
| Example VIII-B6 | Vertical-batch method | 654 | 48 | 177 | Comparative Example |
| Example VIII-B7 | Vertical-batch method | 74.4 | 39 | 48.4 | Comparative Example |
| Example VIII-B8 | Vertical-batch method | 257 | 38 | 85.6 | Comparative Example |
| Example VIII-B9 | Vertical-batch method | 88.0 | 41 | 47.6 | Comparative Example |
| Example VIII-B10 | Vertical-batch method | 311 | 46 | 89.6 | Comparative Example |
| Example VIII-B11 | Vertical-batch method | 248 | 44 | 60.0 | Comparative Example |
| Example VIII-B12 | Vertical-batch method | 223 | 31 | 84.4 | Comparative Example |
| Examples VIII-B13 | Vertical-batch method | 350 | 38 | 180 | Comparative Example | mechanical polishing to a mirror surface where the arithmetic average roughness Ra of the main surface defined by JIS B0601: 2001 is less than or equal to 0.3 nm.

3. Rough Cleaning

The polished conductive GaAs substrate is, in accordance with the vertical-batch method, immersed for 5 minutes in a 0.5% by volume tetramethylammonium hydroxide aqueous solution at room temperature (25° C.), rinsed for 3 minutes with ultra-pure water (electric resistivity (specific resistance) of greater than or equal to 18 MΩ·cm, TOC (total organic carbon) of less than 10 μg/L (liter), and a fine particle number of less than 100 particles/(L) liter, the same applies thereinafter), immersed for 5 minutes with 0.5% by volume tetramethylammonium hydroxide aqueous solution at room temperature (25° C.), and immersed in ultrapure water at room temperature (25° C.).

4. Precision Cleaning

The roughly cleaned conductive GaAs substrate is cleaned precisely by the following acid cleaning, ultra-pure water rinsing twice, and drying in accordance with the face down-single wafer method or the vertical-batch method. In regard to the face down-single wafer method, as Examples IX-M1 to IX-M3, with the use of the cleaning apparatus shown in FIG. 9, in the acid cleaning, a nitric acid aqueous solution of pH 5 at room temperature (25° C.) is supplied at 1 liter (liter) for 1 minute to the main surface of the n-GaAs substrate, and in the ultra-pure water rinsing, ultra-pure water is supplied at 1 L (liter) for 1 minute to the main surface of the conductive GaAs substrate at room temperature (25° C.). In the vertical-batch method, as Examples IX-B1 to IX-B13, in the acid washing, the substrate is immersed for 3 minutes in 10 L (liter) of a nitric acid aqueous solution at pH 5 at room temperature (25° C.), and in the ultra-pure water rinsing, ultra-pure water is supplied at 15 L (liter)/min for 3 minutes at room temperature (25° C.). In addition, in the drying, centrifugal sweep drying is carried out in any of the face down-single wafer method and the vertical-batch method.

The number of particles of greater than or equal to 0.19 μm in particle size per 1 $cm^2$ in the part excluding an annular part of 3 mm from the outer edge on the main surface of the conductive GaAs substrate after the precision cleaning is measured as LPDs (light point defects) under the conditions of Gain 4 and Throughput medium with the use of Surfscan 6220 (light source: an argon ion laser with a wavelength of 488 nm) manufactured by Tencor Corporation. Table 7 summarizes the number (particles/$cm^2$) of particles of greater than or equal to 0.19 μm in particle size per 1 $cm^2$ on the main surface of the conductive GaAs substrate, and the proportion (%) of the number of particles of greater than or equal to 0.19 μm in particle size on the outer periphery to that on the main surface.

5. Growth of Epitaxial Layer

On the main surface of the conductive GaAs substrate subjected to the precision cleaning, an $Al_{0.5}Ga_{0.5}As$ layer with a thickness of 5 μm is grown as an epitaxial layer by the MOVPE method.

The number of LPDs (light point defects) of greater than or equal to 0.24 μm in circle-equivalent diameter per 1 $cm^2$ in the part excluding an annular part of 3 mm from the outer edge on the main surface of the epitaxial layer of the obtained epilayer-attached conductive GaAs substrate is measured under the conditions of Gain 4 and Throughput medium with the use of Surfscan 6220 (light source: an argon ion laser with a wavelength of 488 nm) manufactured by Tencor Corporation. The results are summarized in Table 7. Furthermore, the relation between the number of particles of greater than or equal to 0.19 μm in particle size per 1 $cm^2$ on the main surface of the n-GaAs substrate and the number of LPDs (light point defects) of greater than or equal to 18 μm in circle-equivalent diameter per 1 $cm^2$ on the main surface of the epitaxial layer of the epilayer-attached conductive GaAs substrate is plotted in FIG. 10.

TABLE 7

| Example | Cleaning Method | The number of particles of greater than or equal to 0.19 μm in particle size per 1 $cm^2$ on the main surface of conductive GaAs substrate (Si-doped) (particles/$cm^2$) | The proportion of the number of particles of greater than or equal to 0.19 μm in particle size on the outer periphery to that on the main surface of conductive GaAs substrate (Si-doped) (%) | The number of LPDs of greater than or equal to 18 μm in circle-equivalent diameter per 1 $cm^2$ on the main surface of the epilayer of the epilayer-attached conductive GaAs substrate (Si-doped) (particles/$cm^2$) | Remarks |
|---|---|---|---|---|---|
| Example IX-M1 | Face down-single wafer method | 0.50 | 72 | 3.80 | Reference Example |
| Example IX-M2 | Face down-single wafer method | 0.48 | 81 | 2.60 | Reference Example |
| Example IX-M3 | Face down-single wafer method | 0.44 | 72 | 1.80 | Reference Example |
| Example IX-B1 | Vertical-batch method | 0.64 | 44 | 3.80 | Reference Example |
| Example IX-B2 | Vertical-batch method | 0.45 | 43 | 4.40 | Reference Example |
| Example IX-B3 | Vertical-batch method | 0.85 | 29 | 6.80 | Reference Example |
| Example IX-B4 | Vertical-batch method | 0.63 | 41 | 5.70 | Reference Example |
| Example IX-B5 | Vertical-batch method | 0.68 | 22 | 5.60 | Reference Example |
| Example IX-B6 | Vertical-batch method | 0.45 | 31 | 3.90 | Reference Example |
| Example IX-B7 | Vertical-batch method | 0.38 | 41 | 3.30 | Reference Example |
| Example IX-B8 | Vertical-batch method | 0.44 | 29 | 10.9 | Reference Example |

TABLE 7-continued

| Example | Cleaning Method | The number of particles of greater than or equal to 0.19 μm in particle size per 1 cm² on the main surface of conductive GaAs substrate (Si-doped) (particles/cm²) | The proportion of the number of particles of greater than or equal to 0.19 μm in particle size on the outer periphery to that on the main surface of conductive GaAs substrate (Si-doped) (%) | The number of LPDs of greater than or equal to 18 μm in circle-equivalent diameter per 1 cm² on the main surface of the epilayer of the epilayer-attached conductive GaAs substrate (Si-doped) (particles/cm²) | Remarks |
|---|---|---|---|---|---|
| Example IX-B9 | Vertical-batch method | 0.51 | 39 | 5.00 | Reference Example |
| Example IX-B10 | Vertical-batch method | 0.50 | 44 | 5.20 | Reference Example |
| Example IX-B11 | Vertical-batch method | 0.68 | 41 | 11.5 | Reference Example |
| Example IX-B12 | Vertical-batch method | 0.53 | 31 | 11.0 | Reference Example |
| Example IX-B13 | Vertical-batch method | 0.48 | 44 | 7.00 | Reference Example |

With reference to Table 7 and FIG. 10, it is difficult to evaluate the correlation between the number of particles of greater than or equal to 0.19 μm in particle size per 1 cm² on the main surface of the conductive GaAs substrate and the number of LPDs of greater than or equal to 18 μm in circle-equivalent dimeter per 1 cm² on the main surface of the epilayer-attached conductive GaAs substrate in a case where the epitaxial layer has a thickness of 3.0 μm by LPD measurement with the use of Surfscan 6220 (light source: an argon ion laser with a wavelength of 488 nm) manufactured by Tencor Corporation.

Experimental Example X

A conductive GaAs crystalline body doped with Si atoms, manufactured by the VB method is sliced and chamfered to prepare a plurality of n-type conductive GaAs substrates of 6 inches in diameter and 750 μm in thickness. For the prepared conductive GaAs substrates, the specific resistance, as measured by a Hall measurement method, is $2\times10^{-3}$ Ω·cm. The main surfaces of the processed conductive GaAs substrates are polished and subjected to rough cleaning and precision cleaning in the same way as in Experiment Example IX.

The number of particles of greater than or equal to 0.079 μm in particle size per 1 cm² in the part excluding an annular part of 3 mm from the outer edge on the main surface of the conductive GaAs substrate after the precision cleaning is measured as LPDs (light point defects) under the conditions of the high incident mode and standard scan mode with the use of WM-10 (light source: a semiconductor laser with a wavelength of 405 nm) manufactured by TOPCON CORPORATION. Table 8 summarizes the number (particles/cm²) of particles of greater than or equal to 0.079 μm in particle size per 1 cm² on the main surface of the conductive GaAs substrate, and the proportion (%) of the number of particles of greater than or equal to 0.079 μm in particle size on the outer periphery to that on the main surface.

On the main surface of the processed conductive GaAs substrate, an $Al_{0.5}Ga_{0.5}As$ layer with a thickness of 5 μm is grown as an epitaxial layer by the MOVPE method. The number of LPDs (light point defects) of greater than or equal to 0.136 μm in circle-equivalent diameter per 1 cm² in the part excluding an annular part of 3 mm from the outer edge on the main surface of the epitaxial layer of the obtained epilayer-attached conductive GaAs substrate is measured under the conditions of the high incident mode and standard scan mode with the use of WM-10 (light source: a semiconductor laser with a wavelength of 405 nm) manufactured by TOPCON CORPORATION. The results are summarized in Table 10. Furthermore, the relation between the number of particles of greater than or equal to 0.079 μm in particle size per 1 cm² on the main surface of the conductive GaAs substrate and the number of LPDs (light point defects) of greater than or equal to 3.0 μm in circle-equivalent diameter per 1 cm² on the main surface of the epitaxial layer of the epilayer-attached conductive GaAs substrate is plotted in FIG. 11.

TABLE 8

| Example | Cleaning Method | The number of particles of greater than or equal to 0.079 μm in particle size per 1 cm² on the main surface of conductive GaAs substrate (Si-doped) (particles/cm²) | The proportion of the number of particles of greater than or equal to 0.079 μm in particle size on the outer periphery to that on the main surface of conductive GaAs substrate (Si-doped) (%) | The number of LPDs of greater than or equal to 3.0 μm in circle-equivalent diameter per 1 cm² on the main surface of the epilayer of the epilayer-attached conductive GaAs substrate (Si-doped) (particles/cm²) | Remarks |
|---|---|---|---|---|---|
| Example X-M1 | Face down-single wafer method | 0.68 | 77 | 4.50 | Examples |
| Example X-M2 | Face down-single wafer method | 0.56 | 69 | 3.30 | Examples |
| Example X-M3 | Face down-single wafer method | 0.63 | 73 | 5.00 | Examples |
| Example X-B1 | Vertical-batch method | 4.19 | 39 | 5.70 | Comparative Example |
| Example X-B2 | Vertical-batch method | 4.46 | 29 | 5.70 | Comparative Example |

TABLE 8-continued

| Example | Cleaning Method | The number of particles of greater than or equal to 0.079 μm in particle size per 1 cm² on the main surface of conductive GaAs substrate (Si-doped) (particles/cm²) | The proportion of the number of particles of greater than or equal to 0.079 μm in particle size on the outer periphery to that on the main surface of conductive GaAs substrate (Si-doped) (%) | The number of LPDs of greater than or equal to 3.0 μm in circle-equivalent diameter per 1 cm² on the main surface of the epilayer of the epilayer-attached conductive GaAs substrate (Si-doped) (particles/cm²) | Remarks |
|---|---|---|---|---|---|
| Example X-B3 | Vertical-batch method | 1.93 | 33 | 6.20 | Comparative Example |
| Example X-B4 | Vertical-batch method | 2.94 | 41 | 6.90 | Comparative Example |
| Example X-B5 | Vertical-batch method | 2.54 | 26 | 5.60 | Comparative Example |
| Example X-B6 | Vertical-batch method | 3.57 | 33 | 6.80 | Comparative Example |
| Example X-B7 | Vertical-batch method | 2.21 | 31 | 5.10 | Comparative Example |
| Example X-B8 | Vertical-batch method | 3.29 | 43 | 10.4 | Comparative Example |
| Example X-B9 | Vertical-batch method | 5.55 | 41 | 12.5 | Comparative Example |
| Example X-B10 | Vertical-batch method | 5.89 | 39 | 17.5 | Comparative Example |
| Example X-B11 | Vertical-batch method | 4.03 | 39 | 15.6 | Comparative Example |
| Example X-B12 | Vertical-batch method | 3.76 | 25 | 10.5 | Comparative Example |
| Example X-B13 | Vertical-batch method | 4.59 | 31 | 8.00 | Comparative Example |

With reference to Table 8 and FIG. 11, changing the precision cleaning from the vertical-batch method to the face down-single wafer method makes it possible to reduce particles of greater than or equal to 0.079 μm in particle size on the main surface of the conductive GaAs substrate, and as a result, reduce LPDs of greater than or equal to 3.0 μm in circle-equivalent diameter on the main surface in a case where the epitaxial layer of the epilayer-attached conductive GaAs substrate has a thickness of 5 μm. In addition, the adjustment of particles of greater than or equal to 0.079 μm in particle size on the main surface of the conductive GaAs substrate to less than or equal to 1.0 particle/cm², makes it possible to reduce LPDs of greater than or equal to 3.0 μm in circle-equivalent diameter on the main surface in a case where the epitaxial layer of the epilayer-attached conductive GaAs substrate has a thickness of 5 μm, to less than or equal to 5 defects/cm².

Experimental Example XI

A semi-insulating GaAs crystalline body doped with C atoms, manufactured by the VB method is sliced and chamfered to prepare a plurality of semi-insulating GaAs substrates of 6 inches in diameter and 750 μm in thickness. For the prepared semi-insulating GaAs substrates, the specific resistance, as measured by a Hall measurement method, is 2×10⁸ Ω·cm. The main surfaces of the processed semi-insulating GaAs substrates are polished and subjected to rough cleaning and precision cleaning in the same way as in Experiment Example IX, and then, an GaAs layer (epitaxial layer) is grown on the main surfaces.

Table 9 summarizes, in the same manner as in Experimental Example IX, the number (particles/cm²) of particles of greater than or equal to 0.19 μm in particle size per 1 cm² on the main surface of the semi-insulating GaAs substrate, the proportion (%) of the number of particles of greater than or equal to 0.19 μm in particle size on the outer periphery to that on the main surface, and the number (defects/cm²) of LPDs of greater than or equal to 3.0 μm in circle-equivalent diameter per 1 cm² on the main surface of the epitaxial layer. Furthermore, the relation between the number of particles of greater than or equal to 0.19 μm in particle size per 1 cm² on the main surface of the semi-insulating GaAs substrate and the number of LPDs of greater than or equal to 18 μm in circle-equivalent diameter per 1 cm² on the main surface of the epitaxial layer of the epilayer-attached semi-insulating GaAs substrate is plotted in FIG. 12.

TABLE 9

| Example | Cleaning Method | The number of particles of greater than or equal to 0.19 μm in particle size per 1 cm² on the main surface of semi-insulating GaAs substrate (C-doped) (particles/cm²) | The proportion of the number of particles of greater than or equal to 0.19 μm in particle size on the outer periphery to that on the main surface of semi-insulating GaAs substrate (C-doped) (%) | The number of LPDs of greater than or equal to 18 μm in circle-equivalent diameter per 1 cm² on the main surface of the epilayer of the epilayer-attached semi-insulating GaAs substrate (C-doped) (particles/cm²) | Remarks |
|---|---|---|---|---|---|
| Example XI-M1 | Face down-single wafer method | 2.27 | 77 | 5.70 | Reference Example |

TABLE 9-continued

| Example | Cleaning Method | The number of particles of greater than or equal to 0.19 μm in particle size per 1 cm² on the main surface of semi-insulating GaAs substrate (C-doped) (particles/cm²) | The proportion of the number of particles of greater than or equal to 0.19 μm in particle size on the outer periphery to that on the main surface of semi-insulating GaAs substrate (C-doped) (%) | The number of LPDs of greater than or equal to 18 μm in circle-equivalent diameter per 1 cm² on the main surface of the epilayer of the epilayer-attached semi-insulating GaAs substrate (C-doped) (particles/cm²) | Remarks |
|---|---|---|---|---|---|
| Example XI-M2 | Face down-single wafer method | 3.00 | 69 | 6.80 | Reference Example |
| Example XI-M3 | Face down-single wafer method | 2.31 | 71 | 8.00 | Reference Example |
| Example XI-B1 | Vertical-batch method | 3.08 | 41 | 10.7 | Reference Example |
| Example XI-B2 | Vertical-batch method | 2.43 | 31 | 9.00 | Reference Example |
| Example XI-B3 | Vertical-batch method | 3.64 | 46 | 10.8 | Reference Example |
| Example XI-B4 | Vertical-batch method | 2.78 | 40 | 11.6 | Reference Example |
| Example XI-B5 | Vertical-batch method | 4.48 | 29 | 10.5 | Reference Example |
| Example XI-B6 | Vertical-batch method | 3.13 | 28 | 8.20 | Reference Example |
| Example XI-B7 | Vertical-batch method | 2.26 | 44 | 8.50 | Reference Example |
| Example XI-B8 | Vertical-batch method | 4.59 | 41 | 9.60 | Reference Example |
| Example XI-B9 | Vertical-batch method | 4.07 | 33 | 11.4 | Reference Example |
| Example XI-B10 | Vertical-batch method | 3.45 | 39 | 13.1 | Reference Example |
| Example XI-B11 | Vertical-batch method | 3.68 | 41 | 10.8 | Reference Example |
| Example XI-B12 | Vertical-batch method | 2.82 | 33 | 8.50 | Reference Example |
| Example XI-B13 | Vertical-batch method | 3.79 | 42 | 9.40 | Reference Example |

With reference to Table 9 and FIG. 12, the correlation is not made clear between the number of particles of greater than or equal to 0.19 μm in particle size per 1 cm² on the main surface of the semi-insulating GaAs substrate and the number of LPDs of greater than or equal to 18 μm in circle-equivalent dimeter per 1 cm² on the main surface of the epilayer-attached semi-insulating GaAs substrate in a case where the epitaxial layer has a thickness of 5 μm by LPD measurement with the use of Surfscan 6220 (light source: an argon ion laser with a wavelength of 488 nm) manufactured by Tencor Corporation, but it is clear that the LPD after the epi is reduced by the face down-single wafer method, as compared with the case of cleaning the main surface by the vertical-batch method.

More specifically, as to the semi-insulating GaAs substrate subjected to the precision cleaning by the face down-single wafer method, the number of LPDs of greater than or equal to 18 μm in circle-equivalent diameter per 1 cm² on the main surface of the epitaxial layer disposed on the substrate is further reduced, even if the semi-insulating GaAs substrate subjected to the precision cleaning by the face down-single wafer method is comparable to the semi-insulating GaAs substrate subjected to the precision by the vertical-batch method, in the number of particles of greater than or equal to 0.19 μm in particle size per 1 cm² on the main surface of the substrate. Specifically, the epilayer-attached semi-insulating GaAs substrate includes particles of greater than or equal to 0.19 μm in particle size at less than or equal to 3.0 particles/cm² on the main surface, and includes LPDs of greater than or equal to 18 μm in circle-equivalent diameter at less than or equal to 8.0 particles/cm² on the main surface in a case where the epitaxial layer has a thickness of 5 μm. However, the detailed reason therefor is not clear.

Experimental Example XII

For the semi-insulating GaAs substrates prepared in the same way as Examples XI-M1 to XI-M3 of Experiment Example XI, the number of particles of greater than or equal to 0.19 μm in particle size per 1 cm² on the main surface is measured in the same way as in Experiment Example IX. In the same way as in Experimental Example II, the semi-insulating GaAs substrates each with a protective film formed on the main surface is prepared, and stored for 1 year. On the main surface of the semi-insulating GaAs substrate coated with the protective film after the storage for 1 year, an $Al_{0.5}Ga_{0.5}As$ layer of 5 μm in thickness is grown as an epitaxial layer in the same way as in Experimental Example IX. The number of particles of greater than or equal to 0.19 μm in particle size per 1 cm² on the main surface of the semi-insulating GaAs substrate before the storage for 1 year and the number of LPDs of greater than or equal to 18 μm in circle-equivalent diameter per 1 cm² on the main surface of the epitaxial layer thereof are measured in the same way as in Experimental Example IX.

With respect to the obtained epilayer-attached semi-insulating GaAs substrate, particles of greater than or equal to 0.19 μm in particle size on the main surface of the semi-insulating GaAs substrate before the storage for 1 year correspond to 2.50 particles/cm² (that is, less than or equal to 3.0 particles/cm²), and LPDs of greater than or equal to 18 µm in circle-equivalent diameter on the epitaxial layer of 5 µm in thickness, grown on the main surface of the semi-insulating GaAs substrate after the storage for 1 year correspond to 3.30 defects/cm² (that is, less than or equal to 8.0 defects/cm²). As just described, coating the main surface of the semi-insulating GaAs substrate with the protective film in this manner makes it possible to, even after the storage for 1 year, cause the less defective epitaxial layer to grow on the main surface of the semi-insulating GaAs substrate, coated with the protective film.

Experimental Example XIII

A semi-insulating GaAs crystalline body doped with C atoms, manufactured by the VB method is sliced and chamfered to prepare a plurality of semi-insulating GaAs substrates of 6 inches in diameter and 750 µm in thickness. For the prepared semi-insulating GaAs substrates, the specific resistance, as measured by a Hall measurement method, is 2×10⁸ Ω·cm. The main surfaces of the processed semi-insulating GaAs substrates are polished and subjected to rough cleaning and precision cleaning in the same way as in Experiment Example IX, and then, an InP layer (epitaxial layer) is grown on the main surfaces.

Table 10 summarizes, in the same manner as in Experimental Example X, the number (particles/cm²) of particles of greater than or equal to 0.079 µm in particle size per 1 cm² on the main surface of the semi-insulating GaAs substrate, the proportion (%) of the number of particles of greater than or equal to 3.0 µm in particle size on the outer periphery to that on the main surface, and the number (defects/cm²) of LPDs of greater than or equal to 3.0 µm in circle-equivalent diameter per 1 cm² on the main surface of the epitaxial layer. Furthermore, the relation between the number of particles of greater than or equal to 0.079 µm in particle size per 1 cm² on the main surface of the semi-insulating GaAs substrate and the number of LPDs of greater than or equal to 3.0 µm in circle-equivalent diameter per 1 cm² on the main surface of the epitaxial layer of the epilayer-attached i-GaAs substrate is plotted in FIG. 13.

TABLE 10

| Example | Cleaning Method | The number of particles of greater than or equal to 0.079 µm in particle size per 1 cm² on the main surface of semi-insulating GaAs substrate (C-doped) (particles/cm²) | The proportion of the number of particles of greater than or equal to 0.079 µm in particle size on the outer periphery to that on the main surface of semi-insulating GaAs substrate (C-doped) (%) | The number of LPDs of greater than or equal to 3.0 µm in circle-equivalent diameter per 1 cm² on the main surface of the epilayer of the epilayer-attached semi-insulating GaAs substrate (C-doped) (particles/cm²) | Remarks |
|---|---|---|---|---|---|
| Example XIII-M1 | Face down-single wafer method | 9.08 | 69 | 5.90 | Examples |
| Example XIII-M2 | Face down-single wafer method | 12.0 | 77 | 8.20 | Examples |
| Example XIII-M3 | Face down-single wafer method | 9.26 | 81 | 9.60 | Examples |
| Example XIII-B1 | Vertical-batch method | 12.3 | 29 | 32.2 | Comparative Example |
| Example XIII-B2 | Vertical-batch method | 9.71 | 39 | 27.1 | Comparative Example |
| Example XIII-B3 | Vertical-batch method | 14.6 | 41 | 32.5 | Comparative Example |
| Example XIII-B4 | Vertical-batch method | 11.1 | 27 | 34.7 | Comparative Example |
| Example XIII-B5 | Vertical-batch method | 17.9 | 41 | 31.5 | Comparative Example |
| Example XIII-B6 | Vertical-batch method | 12.5 | 33 | 24.5 | Comparative Example |
| Example XIII-B7 | Vertical-batch method | 9.03 | 37 | 25.4 | Comparative Example |
| Example XIII-B8 | Vertical-batch method | 18.4 | 31 | 28.7 | Comparative Example |
| Example XIII-B9 | Vertical-batch method | 16.3 | 41 | 34.1 | Comparative Example |
| Example XIII-B10 | Vertical-batch method | 13.8 | 39 | 39.2 | Comparative Example |
| Example XIII-B11 | Vertical-batch method | 14.7 | 45 | 32.4 | Comparative Example |
| Example XIII-B12 | Vertical-batch method | 11.3 | 39 | 25.6 | Comparative Example |
| Example XIII-B13 | Vertical-batch method | 15.1 | 31 | 28.3 | Comparative Example |

With reference to Table 10 and FIG. 13, the correlation is not made clear between the number of particles of greater than or equal to 0.079 μm in particle size per 1 $cm^2$ on the main surface of the semi-insulating GaAs substrate and the number of LPDs of greater than or equal to 3.0 μm in circle-equivalent dimeter per 1 $cm^2$ on the main surface of the epilayer-attached semi-insulating GaAs substrate in a case where the epitaxial layer has a thickness of 5 μm even by LPD measurement with the use of WM-10 (light source: a semiconductor laser with a wavelength of 488 nm) manufactured by TOPCON CORPORATION, but it is clear that the LPD after the epi is reduced by the face down-single wafer method, as compared with the case of cleaning the main surface by the vertical-batch method.

More specifically, as to the semi-insulating GaAs substrate subjected to the precision cleaning by the face down-single wafer method, the number of LPDs of greater than or equal to 3.0 μm in circle-equivalent diameter per 1 $cm^2$ on the Main surface of the epitaxial layer disposed on the substrate is further reduced, even if the semi-insulating GaAs substrate subjected to the precision cleaning by the face down-single wafer method is comparable to the semi-insulating GaAs substrate subjected to the precision by the vertical-batch method, in the number of particles of greater than or equal to 0.079 μm in particle size per 1 $cm^2$ on the main surface of the substrate. Specifically, the epilayer-attached semi-insulating GaAs substrate includes particles of greater than or equal to 0.079 μm in particle size at less than or equal to 12 particles/$cm^2$ on the main surface, and includes light point defects of greater than or equal to 3.0 μm in circle-equivalent diameter at less than or equal to 10 defects/$cm^2$ on the main surface in a case where the epitaxial layer has a thickness of 5 μm. However, the detailed reason therefor is not clear.

Experimental Example XIV

For the semi-insulating GaAs substrates prepared in the same way as Examples XIII-M1 to XIII-M3 of Experiment Example XIII, the number of particles of greater than or equal to 0.079 μm in particle size per 1 $cm^2$ on the main surface is measured in the same way as in Experiment Example X. In the same way as in Experimental Example II, the semi-insulating GaAs substrates each with a protective film formed on the main surface is prepared, and stored for 1 year. On the main surface of the semi-insulating GaAs substrate coated with the protective film after the storage for 1 year, an $Al_{0.5}Ga_{0.5}As$ layer of 5 μm in thickness is grown as an epitaxial layer in the same way as in Experimental Example IX. The number of particles of greater than or equal to 0.079 μm in particle size per 1 $cm^2$ on the main surface of the semi-insulating GaAs substrate before the storage for 1 year and the number of LPDs of greater than or equal to 3.0 μm in circle-equivalent diameter per 1 $cm^2$ on the main surface of the epitaxial layer thereof are measured in the same way as in Experimental Example X.

With respect to the obtained epilayer-attached semi-insulating GaAs substrate, particles of greater than or equal to 0.079 μm in particle size on the main surface of the semi-insulating GaAs substrate before the storage for 1 year correspond to 10.3 particles/$cm^2$ (that is, less than or equal to 12 particles/$cm^2$), and LPDs of greater than or equal to 3.0 μm in circle-equivalent diameter on the epitaxial layer of 5 μm in thickness, grown on the main surface of the semi-insulating GaAs substrate after the storage for 1 year correspond to 8.1 defects/$cm^2$ (that is, less than or equal to 10 defects/$cm^2$). As just described, coating the main surface of the semi-insulating GaAs substrate with the protective film in this manner makes it possible to, even after the storage for 1 year, cause the less defective epitaxial layer to grow on the main surface of the semi-insulating GaAs substrate, coated with the protective film.

The embodiments and examples disclosed herein should be considered by way of example in all respects, but not restrictive. The scope of the present invention is defined not by the embodiments and examples mentioned above, but by the claims, and intended to encompass meanings equivalent to the claims, and all changes within the scope.

REFERENCE SIGNS LIST

10: group III-V compound semiconductor substrate
10m: main surface, 20: cleaning apparatus, 21: holder, 23: cleaning liquid tank, 25: chamber, S10: processing step, S20: polishing step, S30: rough cleaning step, S40: precision cleaning step, S41: sulfuric acid/hydrogen peroxide mixture cleaning step, S42: phosphoric acid cleaning step, S43: drying step, S50: protective film forming step, P1: inner periphery, P2: outer periphery

The invention claimed is:

1. A group III-V compound semiconductor substrate being an indium phosphide substrate, the group III-V compound semiconductor substrate comprising particles of greater than or equal to 0.19 μm in particle size at less than or equal to 0.22 particles/$cm^2$ on a main surface.

2. A group III-V compound semiconductor substrate being an indium phosphide substrate, the group III-V compound semiconductor substrate comprising particles of greater than or equal to 0.079 μm in particle size at less than or equal to 20 particles/$cm^2$ on a main surface.

3. The group III-V compound semiconductor substrate according to claim 2, wherein
the group III-V compound semiconductor substrate is a semi-insulating indium phosphide substrate, and
the main surface is coated with a protective film.

4. A group III-V compound semiconductor substrate being a conductive gallium arsenide substrate, the group III-V compound semiconductor substrate comprising particles of greater than or equal to 0.079 μm in particle size at less than or equal to 1.0 particle/$cm^2$ on a main surface.

5. The group III-V compound semiconductor substrate according to claim 1, wherein
the group III-V compound semiconductor substrate is a semi-insulating indium phosphide substrate, and
the main surface is coated with a protective film.

6. The group III-V compound semiconductor substrate according to claim 5, wherein the protective film has a thickness of greater than or equal to 0.3 nm and less than or equal to 3 nm.

7. The group III-V compound semiconductor substrate according to claim 1, wherein
the main surface is formed of an inner periphery and an outer periphery,
the inner periphery is a circular part at a center of the main surface, the outer periphery is an annular part surrounding the inner periphery,
an area of the inner periphery is equal to an area of the outer periphery, and
a proportion of a number of particles present at the outer periphery to a number of particles present over the inner periphery and the outer periphery, is greater than or equal to 50%.

8. The group III-V compound semiconductor substrate according to claim 2, wherein
the main surface is formed of an inner periphery and an outer periphery,
the inner periphery is a circular part at a center of the main surface, the outer periphery is an annular part surrounding the inner periphery,
an area of the inner periphery is equal to an area of the outer periphery, and
a proportion of a number of particles present at the outer periphery to a number of particles present over the inner periphery and the outer periphery, is greater than or equal to 50%.

9. The group III-V compound semiconductor substrate according to claim 4, wherein
the main surface is formed of an inner periphery and an outer periphery,
the inner periphery is a circular part at a center of the main surface, the outer periphery is an annular part surrounding the inner periphery,
an area of the inner periphery is equal to an area of the outer periphery, and
a proportion of a number of particles present at the outer periphery to a number of particles present over the inner periphery and the outer periphery, is greater than or equal to 50%.

\* \* \* \* \*